(12) United States Patent
Sasagawa et al.

(10) Patent No.: US 7,623,287 B2
(45) Date of Patent: Nov. 24, 2009

(54) NON-PLANAR SURFACE STRUCTURES AND PROCESS FOR MICROELECTROMECHANICAL SYSTEMS

(75) Inventors: Teruo Sasagawa, Los Gatos, CA (US); Lior Kogut, Sunnyvale, CA (US); Ming-Hau Tung, San Francisco, CA (US)

(73) Assignee: Qualcomm Mems Technologies, Inc., San Diego, CA (US)

( * ) Notice: Subject to any disclaimer, the term of this patent is extended or adjusted under 35 U.S.C. 154(b) by 336 days.

(21) Appl. No.: 11/406,866

(22) Filed: Apr. 19, 2006

(65) Prior Publication Data

US 2007/0249079 A1 Oct. 25, 2007

(51) Int. Cl.
*G02B 26/00* (2006.01)
(52) U.S. Cl. .......................... 359/291; 359/290; 430/321
(58) Field of Classification Search .................. 430/321, 430/311; 359/290, 291
See application file for complete search history.

(56) References Cited

U.S. PATENT DOCUMENTS

| | | | |
|---|---|---|---|
| 2,534,846 A | 12/1950 | Ambrose et al. | |
| 3,439,973 A | 4/1969 | Paul et al. | |
| 3,443,854 A | 5/1969 | Weiss | |
| 3,567,847 A | 3/1971 | Price | |
| 3,616,312 A | 10/1971 | McGriff et al. | |
| 3,653,741 A | 4/1972 | Marks | |
| 3,656,836 A | 4/1972 | de Cremoux et al. | |
| 3,725,868 A | 4/1973 | Malmer, Jr. et al. | |
| 3,728,030 A | 4/1973 | Hawes | |
| 3,813,265 A | 5/1974 | Marks | |
| 3,955,880 A | 5/1976 | Lierke | |
| 4,099,854 A | 7/1978 | Decker et al. | |
| 4,196,396 A | 4/1980 | Smith | |
| 4,228,437 A | 10/1980 | Shelton | |

(Continued)

FOREIGN PATENT DOCUMENTS

CH 680534 9/1992

(Continued)

OTHER PUBLICATIONS

Lee et al., "Improvement of the surface characteristics of sputtered metal layer for a MEMS micro-mirror switch," Thin Solid Films, vol. 447, Jan. 30, 2004, pp. 615-618.

(Continued)

*Primary Examiner*—Timothy J Thompson
(74) *Attorney, Agent, or Firm*—Knobbe Martens Olson & Bear LLP

(57) ABSTRACT

Methods of making MEMS devices including interferometric modulators involve depositing various layers, including stationary layers, movable layers and sacrificial layers, on a substrate. A non-planar surface is formed on one or more layers by flowing an etchant through a permeable layer. In one embodiment the non-planar surface is formed on a sacrificial layer. A movable layer formed over the non-planar surface of the sacrificial layer results in a non-planar interface between the sacrificial and movable layers. Removal of the sacrificial layer results in a released MEMS device having reduced contact area between the movable and stationary layers when the MEMS device is actuated. The reduced contact area results in lower adhesion forces and reduced stiction during actuation of the MEMS device. These methods may be used to manufacture released and unreleased interferometric modulators.

39 Claims, 13 Drawing Sheets

U.S. PATENT DOCUMENTS

| | | | |
|---|---|---|---|
| 4,377,324 A | 3/1983 | Durand et al. |
| 4,389,096 A | 6/1983 | Hori et al. |
| 4,392,711 A | 7/1983 | Moraw et al. |
| 4,403,248 A | 9/1983 | te Velde |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,617,608 A | 10/1986 | Blonder et al. |
| 4,662,746 A | 5/1987 | Hornbeck |
| 4,663,083 A | 5/1987 | Marks |
| 4,663,181 A * | 5/1987 | Murali ....................... 427/456 |
| 4,681,403 A | 7/1987 | Te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,859,060 A | 8/1989 | Kitagiri et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zayhowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,512 A | 5/1994 | Allman et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,330,617 A | 7/1994 | Haond |
| 5,331,454 A | 7/1994 | Hornbeck |
| 5,339,116 A | 8/1994 | Urbanus et al. |
| 5,345,328 A | 9/1994 | Fritz et al. |
| 5,347,377 A | 9/1994 | Revelli, Jr. et al. |
| 5,355,357 A | 10/1994 | Yamamori et al. |
| 5,358,601 A | 10/1994 | Cathey |
| 5,365,283 A | 11/1994 | Doherty et al. |
| 5,374,346 A * | 12/1994 | Bladon et al. ................ 205/125 |
| 5,381,232 A | 1/1995 | van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,578,976 A | 11/1996 | Yao |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |

| | | | | | | |
|---|---|---|---|---|---|---|
| 5,610,438 | A | 3/1997 | Wallace et al. | 6,104,525 A | 8/2000 | Min |
| 5,610,624 | A | 3/1997 | Bhuva | 6,113,239 A | 9/2000 | Sampsell et al. |
| 5,610,625 | A | 3/1997 | Sampsell | 6,115,326 A | 9/2000 | Puma et al. |
| 5,619,059 | A | 4/1997 | Li et al. | 6,147,790 A | 11/2000 | Meier et al. |
| 5,619,365 | A | 4/1997 | Rhoades et al. | 6,158,156 A | 12/2000 | Patrick |
| 5,619,366 | A | 4/1997 | Rhoads et al. | 6,160,833 A | 12/2000 | Floyd et al. |
| 5,622,814 | A | 4/1997 | Miyata et al. | 6,165,890 A | 12/2000 | Kohl et al. |
| 5,629,790 | A | 5/1997 | Neukermans et al. | 6,166,422 A | 12/2000 | Qian et al. |
| 5,633,652 | A | 5/1997 | Kanbe et al. | 6,170,332 B1 | 1/2001 | MacDonald et al. |
| 5,636,052 | A | 6/1997 | Arney et al. | 6,180,428 B1 | 1/2001 | Peeters et al. |
| 5,636,185 | A | 6/1997 | Brewer et al. | 6,194,323 B1 | 2/2001 | Downey et al. |
| 5,638,084 | A | 6/1997 | Kalt | 6,195,196 B1 | 2/2001 | Kimura et al. |
| 5,638,946 | A | 6/1997 | Zavracky | 6,201,633 B1 | 3/2001 | Peeters et al. |
| 5,641,391 | A | 6/1997 | Hunter et al. | 6,204,080 B1 | 3/2001 | Hwang |
| 5,646,768 | A | 7/1997 | Kaeiyama | 6,215,221 B1 | 4/2001 | Cabuz et al. |
| 5,647,819 | A | 7/1997 | Fujita et al. | 6,229,683 B1 | 5/2001 | Goodwin-Johansson |
| 5,650,834 | A | 7/1997 | Nakagawa et al. | 6,232,936 B1 | 5/2001 | Gove et al. |
| 5,650,881 | A | 7/1997 | Hornbeck | 6,243,149 B1 | 6/2001 | Swanson et al. |
| 5,654,741 | A | 8/1997 | Sampsell et al. | 6,246,398 B1 | 6/2001 | Koo |
| 5,657,099 | A | 8/1997 | Doherty et al. | 6,249,039 B1 | 6/2001 | Harvey et al. |
| 5,659,374 | A | 8/1997 | Gale, Jr. et al. | 6,282,010 B1 | 8/2001 | Sulzbach et al. |
| 5,665,997 | A | 9/1997 | Weaver et al. | 6,284,560 B1 | 9/2001 | Jech et al. |
| 5,673,139 | A | 9/1997 | Johnson | 6,288,472 B1 | 9/2001 | Cabuz et al. |
| 5,674,757 | A | 10/1997 | Kim | 6,288,824 B1 | 9/2001 | Kastalsky et al. |
| 5,683,591 | A | 11/1997 | Offenberg | 6,295,154 B1 | 9/2001 | Laor et al. |
| 5,703,710 | A | 12/1997 | Brinkman et al. | 6,297,072 B1 | 10/2001 | Tilmans et al. |
| 5,706,022 | A | 1/1998 | Hato | 6,323,982 B1 | 11/2001 | Hornbeck |
| 5,710,656 | A | 1/1998 | Goosen | 6,324,192 B1 | 11/2001 | Tayebati |
| 5,726,480 | A | 3/1998 | Pister | 6,327,071 B1 | 12/2001 | Kimura et al. |
| 5,739,945 | A | 4/1998 | Tayebati | 6,329,297 B1 | 12/2001 | Balish et al. |
| 5,745,193 | A | 4/1998 | Urbanus et al. | 6,335,831 B2 | 1/2002 | Kowarz et al. |
| 5,745,281 | A | 4/1998 | Yi et al. | 6,351,329 B1 | 2/2002 | Greywal |
| 5,771,116 | A | 6/1998 | Miller et al. | 6,356,254 B1 | 3/2002 | Kimura |
| 5,771,321 | A | 6/1998 | Stern | 6,359,673 B1 | 3/2002 | Stephenson |
| 5,784,189 | A | 7/1998 | Bozler et al. | 6,376,787 B1 | 4/2002 | Martin et al. |
| 5,784,190 | A | 7/1998 | Worley | 6,377,233 B2 | 4/2002 | Colgan et al. |
| 5,784,212 | A | 7/1998 | Hornbeck | 6,391,675 B1 | 5/2002 | Ehmke et al. |
| 5,793,504 | A | 8/1998 | Stoll | 6,392,233 B1 | 5/2002 | Channin et al. |
| 5,808,780 | A | 9/1998 | McDonald | 6,392,781 B1 | 5/2002 | Kim et al. |
| 5,818,095 | A | 10/1998 | Sampsell | 6,407,851 B1 | 6/2002 | Islam et al. |
| 5,822,110 | A | 10/1998 | Dabbaj | 6,447,126 B1 | 9/2002 | Hornbeck |
| 5,822,170 | A | 10/1998 | Cabuz et al. | 6,448,622 B1 | 9/2002 | Franke et al. |
| 5,824,608 | A | 10/1998 | Gotoch et al. | 6,449,084 B1 | 9/2002 | Guo |
| 5,825,528 | A | 10/1998 | Goosen | 6,452,465 B1 | 9/2002 | Brown et al. |
| 5,835,255 | A | 11/1998 | Miles | 6,456,420 B1 | 9/2002 | Goodwin-Johansson |
| 5,838,484 | A | 11/1998 | Goosen et al. | 6,465,355 B1 | 10/2002 | Horsley |
| 5,842,088 | A | 11/1998 | Thompson | 6,466,354 B1 | 10/2002 | Gudeman |
| 5,867,302 | A | 2/1999 | Fleming et al. | 6,466,358 B2 | 10/2002 | Tew |
| 5,896,796 | A | 4/1999 | Chih | 6,473,072 B1 | 10/2002 | Comiskey et al. |
| 5,912,758 | A | 6/1999 | Knipe et al. | 6,473,274 B1 | 10/2002 | Maimone et al. |
| 5,914,803 | A | 6/1999 | Hwang et al. | 6,480,177 B2 | 11/2002 | Doherty et al. |
| 5,920,421 | A | 7/1999 | Choi | 6,496,122 B2 | 12/2002 | Sampsell |
| 5,943,155 | A | 8/1999 | Goossen | 6,513,911 B1 | 2/2003 | Ozaki et al. |
| 5,943,158 | A | 8/1999 | Ford et al. | 6,522,801 B1 | 2/2003 | Aksyuk et al. |
| 5,959,763 | A | 9/1999 | Bozler et al. | 6,531,945 B1 | 3/2003 | Ahn et al. |
| 5,967,163 | A | 10/1999 | Pan et al. | 6,537,427 B1 | 3/2003 | Raina et al. |
| 5,972,193 | A | 10/1999 | Chou et al. | 6,545,335 B1 | 4/2003 | Chua et al. |
| 5,976,902 | A | 11/1999 | Shih | 6,548,908 B2 | 4/2003 | Chua et al. |
| 5,978,127 | A | 11/1999 | Berg | 6,549,338 B1 | 4/2003 | Wolverton et al. |
| 5,986,796 | A | 11/1999 | Miles | 6,552,840 B2 | 4/2003 | Knipe |
| 6,016,693 | A | 1/2000 | Viani et al. | 6,574,033 B1 | 6/2003 | Chui et al. |
| 6,028,690 | A | 2/2000 | Carter et al. | 6,577,785 B1 | 6/2003 | Spahn et al. |
| 6,031,653 | A | 2/2000 | Wang | 6,589,625 B1 | 7/2003 | Kothari et al. |
| 6,038,056 | A | 3/2000 | Florence et al. | 6,597,490 B2 | 7/2003 | Tayebati |
| 6,040,937 | A | 3/2000 | Miles | 6,600,201 B2 | 7/2003 | Hartwell et al. |
| 6,049,317 | A | 4/2000 | Thompson et al. | 6,602,791 B2 | 8/2003 | Ouellet et al. |
| 6,055,090 | A | 4/2000 | Miles | 6,606,175 B1 | 8/2003 | Sampsell et al. |
| 6,057,903 | A | 5/2000 | Colgan et al. | 6,608,268 B1 | 8/2003 | Goldsmith |
| 6,061,075 | A | 5/2000 | Nelson et al. | 6,610,440 B1 | 8/2003 | LaFollette et al. |
| 6,097,145 | A | 8/2000 | Kastalsky et al. | 6,625,047 B2 | 9/2003 | Coleman, Jr. |
| 6,099,132 | A | 8/2000 | Kaeiyama | 6,630,786 B2 | 10/2003 | Cummings et al. |
| 6,100,477 | A | 8/2000 | Randall et al. | 6,632,698 B2 | 10/2003 | Ives |
| 6,100,872 | A | 8/2000 | Aratani et al. | 6,635,919 B1 | 10/2003 | Melendez et al. |

| | | |
|---|---|---|
| 6,642,913 B1 | 11/2003 | Kimura et al. |
| 6,643,069 B2 | 11/2003 | Dewald |
| 6,650,455 B2 | 11/2003 | Miles |
| 6,653,997 B2 | 11/2003 | Van Gorkom et al. |
| 6,657,832 B2 | 12/2003 | Williams et al. |
| 6,666,561 B1 | 12/2003 | Blakley |
| 6,674,090 B1 | 1/2004 | Chua et al. |
| 6,674,562 B1 | 1/2004 | Miles et al. |
| 6,674,563 B2 | 1/2004 | Chui et al. |
| 6,680,792 B2 | 1/2004 | Miles |
| 6,687,896 B1 | 3/2004 | Miles |
| 6,704,475 B2 | 3/2004 | Jin et al. |
| 6,710,908 B2 | 3/2004 | Miles et al. |
| 6,713,235 B1 | 3/2004 | Ide et al. |
| 6,720,267 B1 | 4/2004 | Chen et al. |
| 6,736,987 B1 | 5/2004 | Cho |
| 6,741,377 B2 | 5/2004 | Miles |
| 6,741,384 B1 | 5/2004 | Martin et al. |
| 6,741,503 B1 | 5/2004 | Farris et al. |
| 6,743,570 B2 | 6/2004 | Harnett et al. |
| 6,747,785 B2 | 6/2004 | Chen et al. |
| 6,747,800 B1 | 6/2004 | Lin |
| 6,756,317 B2 | 6/2004 | Sniegowski et al. |
| 6,760,146 B2 | 7/2004 | Ikeda et al. |
| 6,768,097 B1 | 7/2004 | Vikorovitch et al. |
| 6,775,174 B2 | 8/2004 | Huffman et al. |
| 6,778,155 B2 | 8/2004 | Doherty et al. |
| 6,778,306 B2 | 8/2004 | Sniegowski et al. |
| 6,778,728 B2 | 8/2004 | Taylor |
| 6,782,166 B1 | 8/2004 | Grote et al. |
| 6,794,119 B2 | 9/2004 | Miles |
| 6,803,534 B1 | 10/2004 | Chen et al. |
| 6,806,110 B2 | 10/2004 | Lester et al. |
| 6,806,557 B2 * | 10/2004 | Ding ................ 257/659 |
| 6,811,267 B1 | 11/2004 | Allen et al. |
| 6,812,482 B2 | 11/2004 | Fleming et al. |
| 6,819,469 B1 | 11/2004 | Koba |
| 6,822,304 B1 * | 11/2004 | Honer ................ 257/418 |
| 6,822,628 B2 | 11/2004 | Dunphy et al. |
| 6,829,132 B2 | 12/2004 | Martin et al. |
| 6,853,129 B1 | 2/2005 | Cummings et al. |
| 6,855,610 B2 | 2/2005 | Tung et al. |
| 6,859,218 B1 | 2/2005 | Luman et al. |
| 6,859,301 B1 | 2/2005 | Islam et al. |
| 6,861,277 B1 | 3/2005 | Monroe et al. |
| 6,862,022 B2 | 3/2005 | Slupe |
| 6,862,029 B1 | 3/2005 | D'Souza et al. |
| 6,867,896 B2 | 3/2005 | Miles |
| 6,870,581 B2 | 3/2005 | Li et al. |
| 6,870,654 B2 | 3/2005 | Lin et al. |
| 6,881,535 B2 * | 4/2005 | Yamaguchi ................ 430/321 |
| 6,882,458 B2 | 4/2005 | Lin et al. |
| 6,882,461 B1 | 4/2005 | Tsai et al. |
| 6,912,022 B2 | 6/2005 | Lin et al. |
| 6,940,631 B2 | 9/2005 | Ishikawa |
| 6,952,303 B2 | 10/2005 | Lin et al. |
| 6,952,304 B2 | 10/2005 | Mushika et al. |
| 6,953,702 B2 | 10/2005 | Miller et al. |
| 6,958,847 B2 | 10/2005 | Lin |
| 6,972,891 B2 | 12/2005 | Patel et al. |
| 6,980,350 B2 | 12/2005 | Hung et al. |
| 6,982,820 B2 | 1/2006 | Tsai |
| 6,987,432 B2 | 1/2006 | Lutz et al. |
| 6,995,890 B2 | 2/2006 | Lin |
| 6,999,225 B2 | 2/2006 | Lin |
| 6,999,236 B2 | 2/2006 | Lin |
| 7,002,441 B2 * | 2/2006 | Pillans et al. ................ 335/78 |
| 7,006,272 B2 | 2/2006 | Tsai |
| 7,008,812 B1 | 3/2006 | Carley |
| 7,012,726 B1 | 3/2006 | Miles |
| 7,016,095 B2 | 3/2006 | Lin |
| 7,016,099 B2 | 3/2006 | Ikeda et al. |
| 7,027,202 B1 | 4/2006 | Hunter et al. |
| 7,041,224 B2 | 5/2006 | Patel et al. |
| 7,041,571 B2 | 5/2006 | Strane |
| 7,042,619 B1 | 5/2006 | McGinley et al. |
| 7,042,643 B2 | 5/2006 | Miles et al. |
| 7,049,164 B2 | 5/2006 | Bruner |
| 7,078,293 B2 | 7/2006 | Lin et al. |
| 7,110,158 B2 | 9/2006 | Miles |
| 7,119,945 B2 | 10/2006 | Cummings et al. |
| 7,123,216 B1 | 10/2006 | Miles |
| 7,161,730 B2 | 1/2007 | Floyd |
| 7,172,915 B2 | 2/2007 | Lin et al. |
| 7,193,768 B2 | 3/2007 | Lin |
| 7,198,973 B2 | 4/2007 | Lin et al. |
| 7,221,495 B2 | 5/2007 | Miles et al. |
| 7,233,029 B2 | 6/2007 | Mochizuki |
| 7,256,107 B2 | 8/2007 | Takeuchi et al. |
| 7,289,259 B2 | 10/2007 | Chui et al. |
| 7,329,917 B2 * | 2/2008 | Patraw et al. ................ 257/303 |
| 7,373,026 B2 * | 5/2008 | Chui ................ 385/8 |
| 7,382,515 B2 | 6/2008 | Chung et al. |
| 2001/0003487 A1 | 6/2001 | Miles |
| 2001/0010953 A1 | 8/2001 | Kang et al. |
| 2001/0026951 A1 | 10/2001 | Vergani et al. |
| 2001/0028503 A1 | 10/2001 | Flanders et al. |
| 2001/0040649 A1 | 11/2001 | Ozaki |
| 2001/0040675 A1 | 11/2001 | True et al. |
| 2001/0055208 A1 | 12/2001 | Kimura |
| 2002/0003400 A1 | 1/2002 | Lee |
| 2002/0014579 A1 | 2/2002 | Dunfield |
| 2002/0015215 A1 | 2/2002 | Miles |
| 2002/0021485 A1 | 2/2002 | Pilossof |
| 2002/0024711 A1 | 2/2002 | Miles |
| 2002/0027636 A1 | 3/2002 | Yamada |
| 2002/0031155 A1 | 3/2002 | Tayebati et al. |
| 2002/0036304 A1 | 3/2002 | Ehmke et al. |
| 2002/0054422 A1 | 5/2002 | Carr et al. |
| 2002/0054424 A1 | 5/2002 | Miles |
| 2002/0055253 A1 | 5/2002 | Rudhard |
| 2002/0071169 A1 | 6/2002 | Bowers et al. |
| 2002/0075555 A1 | 6/2002 | Miles |
| 2002/0086455 A1 | 7/2002 | Franosch et al. |
| 2002/0109899 A1 | 8/2002 | Ohtaka et al. |
| 2002/0110948 A1 | 8/2002 | Huang et al. |
| 2002/0117728 A1 | 8/2002 | Brosnihan et al. |
| 2002/0126364 A1 | 9/2002 | Miles |
| 2002/0131682 A1 | 9/2002 | Nasiri et al. |
| 2002/0135857 A1 | 9/2002 | Fitzpatrick et al. |
| 2002/0137072 A1 | 9/2002 | Mirkin et al. |
| 2002/0141690 A1 | 10/2002 | Jin et al. |
| 2002/0146200 A1 | 10/2002 | Kudric et al. |
| 2002/0149828 A1 | 10/2002 | Miles et al. |
| 2002/0149850 A1 | 10/2002 | Heffner et al. |
| 2002/0168136 A1 | 11/2002 | Atia et al. |
| 2002/0195681 A1 | 12/2002 | Melendez et al. |
| 2003/0006468 A1 | 1/2003 | Ma et al. |
| 2003/0015936 A1 | 1/2003 | Yoon et al. |
| 2003/0036215 A1 | 2/2003 | Reid |
| 2003/0043157 A1 | 3/2003 | Miles |
| 2003/0053078 A1 | 3/2003 | Missey et al. |
| 2003/0054588 A1 | 3/2003 | Patel et al. |
| 2003/0062186 A1 | 4/2003 | Boroson et al. |
| 2003/0072070 A1 | 4/2003 | Miles |
| 2003/0090350 A1 | 5/2003 | Feng et al. |
| 2003/0091072 A1 | 5/2003 | Wang et al. |
| 2003/0112096 A1 | 6/2003 | Potter |
| 2003/0119221 A1 | 6/2003 | Cunningham et al. |
| 2003/0123126 A1 | 7/2003 | Meyer et al. |
| 2003/0138213 A1 | 7/2003 | Jiin et al. |
| 2003/0152872 A1 | 8/2003 | Miles |
| 2003/0164350 A1 | 9/2003 | Hanson et al. |
| 2003/0201784 A1 | 10/2003 | Potter |
| 2003/0202264 A1 | 10/2003 | Weber et al. |
| 2003/0202265 A1 | 10/2003 | Reboa et al. |

| | | |
|---|---|---|
| 2003/0202266 A1 | 10/2003 | Ring et al. |
| 2003/0231373 A1 | 12/2003 | Kowarz et al. |
| 2004/0008396 A1 | 1/2004 | Stappaerts |
| 2004/0010115 A1 | 1/2004 | Sotzing |
| 2004/0027636 A1 | 2/2004 | Miles |
| 2004/0027701 A1 | 2/2004 | Ishikawa |
| 2004/0028849 A1 | 2/2004 | Stark et al. |
| 2004/0035821 A1 | 2/2004 | Doan et al. |
| 2004/0038513 A1 | 2/2004 | Kohl et al. |
| 2004/0051929 A1 | 3/2004 | Sampsell et al. |
| 2004/0053434 A1 | 3/2004 | Bruner |
| 2004/0056742 A1 | 3/2004 | Dabbaj |
| 2004/0058532 A1 | 3/2004 | Miles et al. |
| 2004/0061543 A1 | 4/2004 | Nam et al. |
| 2004/0063322 A1 | 4/2004 | Yang |
| 2004/0070813 A1 | 4/2004 | Aubuchon |
| 2004/0080035 A1 | 4/2004 | Delapierre |
| 2004/0080807 A1 | 4/2004 | Chen et al. |
| 2004/0080832 A1 | 4/2004 | Singh |
| 2004/0087086 A1 | 5/2004 | Lee |
| 2004/0100677 A1 | 5/2004 | Huibers et al. |
| 2004/0100680 A1 | 5/2004 | Huibers et al. |
| 2004/0124073 A1 | 7/2004 | Pilans et al. |
| 2004/0124483 A1 | 7/2004 | Partridge et al. |
| 2004/0124495 A1 | 7/2004 | Chen et al. |
| 2004/0125281 A1 | 7/2004 | Lin et al. |
| 2004/0125282 A1 | 7/2004 | Lin et al. |
| 2004/0125536 A1 | 7/2004 | Arney et al. |
| 2004/0136045 A1 | 7/2004 | Tran |
| 2004/0136076 A1 | 7/2004 | Tayebati |
| 2004/0145049 A1 | 7/2004 | McKinnell et al. |
| 2004/0145811 A1 | 7/2004 | Lin et al. |
| 2004/0147056 A1 | 7/2004 | McKinnell et al. |
| 2004/0147198 A1 | 7/2004 | Lin et al. |
| 2004/0148009 A1 | 7/2004 | Buzzard |
| 2004/0150869 A1 | 8/2004 | Kasai |
| 2004/0160143 A1 | 8/2004 | Shreeve et al. |
| 2004/0174583 A1 | 9/2004 | Chen et al. |
| 2004/0175577 A1 | 9/2004 | Lin et al. |
| 2004/0179281 A1 | 9/2004 | Reboa |
| 2004/0179445 A1 | 9/2004 | Park |
| 2004/0191937 A1 | 9/2004 | Patel et al. |
| 2004/0191946 A1 | 9/2004 | Patel et al. |
| 2004/0197526 A1 | 10/2004 | Mehta |
| 2004/0201908 A1 | 10/2004 | Kaneko |
| 2004/0207497 A1 | 10/2004 | Hsu et al. |
| 2004/0207897 A1 | 10/2004 | Lin |
| 2004/0207898 A1 | 10/2004 | Lin et al. |
| 2004/0209192 A1 | 10/2004 | Lin et al. |
| 2004/0209195 A1 | 10/2004 | Lin |
| 2004/0212026 A1 | 10/2004 | Van Brocklin et al. |
| 2004/0217264 A1 | 11/2004 | Wood et al. |
| 2004/0217378 A1 | 11/2004 | Martin et al. |
| 2004/0217919 A1 | 11/2004 | Pichl et al. |
| 2004/0218251 A1 | 11/2004 | Piehl et al. |
| 2004/0218334 A1 | 11/2004 | Martin et al. |
| 2004/0218341 A1 | 11/2004 | Martin et al. |
| 2004/0226909 A1 | 11/2004 | Tzeng |
| 2004/0227493 A1 | 11/2004 | Van Brocklin et al. |
| 2004/0240027 A1 | 12/2004 | Lin et al. |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0263944 A1 | 12/2004 | Miles et al. |
| 2005/0001828 A1 | 1/2005 | Martin et al. |
| 2005/0003667 A1 | 1/2005 | Lin et al. |
| 2005/0012577 A1 | 1/2005 | Pillans et al. |
| 2005/0014374 A1 | 1/2005 | Partridge et al. |
| 2005/0020089 A1 | 1/2005 | Shi et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0036192 A1 | 2/2005 | Lin et al. |

| | | |
|---|---|---|
| 2005/0038950 A1 | 2/2005 | Adelmann |
| 2005/0042117 A1 | 2/2005 | Lin |
| 2005/0045276 A1 | 3/2005 | Patel et al. |
| 2005/0046919 A1 | 3/2005 | Taguchi et al. |
| 2005/0046922 A1 | 3/2005 | Lin et al. |
| 2005/0046948 A1 | 3/2005 | Lin |
| 2005/0057442 A1 | 3/2005 | Way |
| 2005/0068583 A1 | 3/2005 | Gutkowski et al. |
| 2005/0068605 A1 | 3/2005 | Tsai |
| 2005/0068606 A1 | 3/2005 | Tsai |
| 2005/0069209 A1 | 3/2005 | Damera-Venkata et al. |
| 2005/0078348 A1 | 4/2005 | Lin |
| 2005/0098840 A1 | 5/2005 | Fuertsch et al. |
| 2005/0118832 A1 | 6/2005 | Korzenski et al. |
| 2005/0128565 A1 | 6/2005 | Ljungblad |
| 2005/0168849 A1 | 8/2005 | Lin |
| 2005/0170670 A1 | 8/2005 | King et al. |
| 2005/0195462 A1 | 9/2005 | Lin |
| 2005/0195467 A1 | 9/2005 | Kothari et al. |
| 2005/0202649 A1 | 9/2005 | Hung et al. |
| 2005/0249966 A1 | 11/2005 | Tung et al. |
| 2005/0250235 A1 | 11/2005 | Miles et al. |
| 2006/0006138 A1 | 1/2006 | Lin |
| 2006/0018348 A1 | 1/2006 | Przybyla et al. |
| 2006/0024620 A1 | 2/2006 | Nikkel et al. |
| 2006/0066511 A1 | 3/2006 | Chui |
| 2006/0066932 A1 | 3/2006 | Chui |
| 2006/0066935 A1 | 3/2006 | Cummings et al. |
| 2006/0076311 A1 | 4/2006 | Tung et al. |
| 2006/0077502 A1 | 4/2006 | Tung et al. |
| 2006/0077518 A1 | 4/2006 | Chui et al. |
| 2006/0077529 A1 | 4/2006 | Chui et al. |
| 2006/0177950 A1 | 8/2006 | Lin et al. |
| 2006/0256420 A1 | 11/2006 | Miles et al. |
| 2006/0257070 A1 | 11/2006 | Lin et al. |
| 2007/0019280 A1 | 1/2007 | Sasagawa et al. |
| 2007/0041703 A1 | 2/2007 | Wang |
| 2007/0042521 A1* | 2/2007 | Yama .......................... 438/48 |
| 2007/0096300 A1 | 5/2007 | Wang et al. |
| 2007/0155051 A1 | 7/2007 | Wang et al. |
| 2007/0170540 A1 | 7/2007 | Chung et al. |
| 2007/0196944 A1 | 8/2007 | Chou et al. |
| 2007/0206267 A1 | 9/2007 | Tung et al. |
| 2007/0269748 A1 | 11/2007 | Miles |
| 2008/0026328 A1 | 1/2008 | Miles |
| 2008/0068699 A1 | 3/2008 | Miles |
| 2008/0130089 A1 | 6/2008 | Miles |
| 2008/0144163 A1 | 6/2008 | Floyd |
| 2008/0226929 A1 | 9/2008 | Chung et al. |
| 2008/0231931 A1 | 9/2008 | Londergan et al. |

FOREIGN PATENT DOCUMENTS

| | | |
|---|---|---|
| CH | 681 047 | 12/1992 |
| CN | 092109265 | 11/2003 |
| DE | 199 38 072 | 3/2000 |
| DE | 10228946 A1 | 1/2004 |
| EP | 0 035 299 | 9/1983 |
| EP | 0173808 | 3/1986 |
| EP | 0 667 548 A1 | 8/1995 |
| EP | 0694801 A | 1/1996 |
| EP | 0695959 | 2/1996 |
| EP | 0 788 005 | 8/1997 |
| EP | 0878824 A2 | 11/1998 |
| EP | 1 170 618 | 1/2002 |
| EP | 1197778 | 4/2002 |
| EP | 1 209 738 | 5/2002 |
| EP | 1258860 A1 | 11/2002 |
| EP | 1 452 481 A | 9/2004 |
| EP | 1 484 635 | 12/2004 |
| FR | 2824643 | 11/2002 |
| JP | 49-004993 | 1/1974 |
| JP | 405275401 A | 10/1993 |

| | | |
|---|---|---|
| JP | 06301054 | 10/1994 |
| JP | 08293580 | 11/1996 |
| JP | 10015520 | 1/1998 |
| JP | 10500224 | 1/1998 |
| JP | 10-148644 | 6/1998 |
| JP | 10-267658 | 10/1998 |
| JP | 11211999 A | 8/1999 |
| JP | 11243214 | 9/1999 |
| JP | 2000-40831 A | 2/2000 |
| JP | 2001-085519 | 3/2001 |
| JP | 2002-0287047 | 3/2001 |
| JP | 2002 062493 | 2/2002 |
| JP | 2002-207182 | 7/2002 |
| JP | 2002-243937 | 8/2002 |
| JP | 2002-270575 | 9/2002 |
| JP | 2002-277771 | 9/2002 |
| JP | 2002-328313 | 11/2002 |
| JP | 2002-341267 | 11/2002 |
| JP | 2002-355800 | 12/2002 |
| JP | 2003-021798 | 1/2003 |
| JP | 2003001598 A | 1/2003 |
| JP | 2003-215475 | 7/2003 |
| JP | 2004-102022 A | 4/2004 |
| JP | 2004-133281 | 4/2004 |
| JP | 2004106074 A | 4/2004 |
| JP | 2004157527 | 6/2004 |
| JP | 2004-212656 | 7/2004 |
| JP | 2005051007 A | 2/2005 |
| KR | 2002-9270 | 10/1999 |
| KR | 2000-0033006 | 6/2000 |
| WO | WO 91/05284 | 4/1991 |
| WO | WO 92/10925 | 6/1992 |
| WO | WO9530924 | 11/1995 |
| WO | WO9717628 | 5/1997 |
| WO | WO9952006 A2 | 10/1999 |
| WO | WO9952006 A3 | 10/1999 |
| WO | WO0114248 | 3/2001 |
| WO | WO 01/63657 | 8/2001 |
| WO | WO 02/24570 | 3/2002 |
| WO | WO 02/38491 | 5/2002 |
| WO | WO 02/079853 | 10/2002 |
| WO | WO03007049 A1 | 1/2003 |
| WO | WO 03/052506 | 6/2003 |
| WO | WO 03/069404 | 8/2003 |
| WO | WO 03/069413 A | 8/2003 |
| WO | WO03069413 A1 | 8/2003 |
| WO | WO03073151 A1 | 9/2003 |
| WO | WO 2004/000717 | 12/2003 |
| WO | WO2004006003 A1 | 1/2004 |
| WO | WO2004026757 A2 | 4/2004 |
| WO | WO 2004/055885 | 7/2004 |
| WO | WO 2004/079056 | 9/2004 |
| WO | WO 2005/006364 | 1/2005 |
| WO | WO 2005/019899 A1 | 3/2005 |
| WO | WO 2005/061378 | 7/2005 |
| WO | WO 2005/085932 A | 9/2005 |
| WO | WO 2006/036385 | 4/2006 |
| WO | WO 2006/036437 | 4/2006 |
| WO | WO 2006/036542 | 4/2006 |

OTHER PUBLICATIONS

ISR and WO for PCT/US07/008564 filed Apr. 5, 2007.
IPRP for PCT/US07/008564 filed Apr. 5, 2007.
Jackson, "Classical Electrodynamics," John Wiley & Sons Inc., pp. 568-573 (1962).
Penta Vacuum MEMS Etcher Specifications, HTTP—WWW.PENTAVACUUM.COM-MEMES.HTM, 2002.
Yao et al., BrF3 dry release technology for large freestanding parylene microstructures and electrostatic actuators, Sensors and Actuators A, vol. 97-98, pp. 771-775, Apr. 2002.
Akasaka, "Three-Dimensional IC Trends," Proceedings of IEEE, vol. 74, No. 12, pp. 1703-1714, (Dec. 1986).
Austrian Search Report dated May 4, 2005.
Austrian Search Report dated Aug. 12, 2005.
Aratani et al., "Surface micromachined tuneable interferometer array," Sensors and Actuators, pp. 17-23, (1994).
Conner, "Hybrid Color Display Using Optical Interference Filter Array," SID Digest, pp. 577-580 (1993).
EP 05255661.0 European Search Report (Dec. 30, 2005).
Fan et al., "Channel Drop Filters in Photonic Crystals," Optics Express, vol. 3, No. 1 (1998).
Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).
Goossen et al., "Possible Display Applications of the Silicon Mechanical Anti-Reflection Switch," Society for Information Display (1994).
Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).
Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.
Gosch, "West Germany Grabs the Lead in X-Ray Lithography," Electronics pp. 78-80 (Feb. 5, 1987).
Harnett et al., "Heat-depolymerizable polycarbonates as electron beam patternable sacrificial layers for nanofluidics," J. Vac. Sci. Technol. B 19(6), (Nov./Dec. 2001), pp. 2842-2845.
Howard et al., "Nanometer-Scale Fabrication Techniques," VLSI Electronics: Microstructure Science, vol. 5, pp. 145-153 and pp. 166-173 (1982).
Ibbotson et al., "Comparison of XeF2 and F-atom reactions with Si and SiO2," Applied Physics Letters, vol. 44, No. 12, pp. 1129-1131 (Jun. 1984).
Jerman et al., "A Miniature Fabry-Perot Interferometer with a Corrugated Silicon Diaphragm Support," (1988).
Joannopoulos et al., "Photonic Crystals: Molding the Flow of Light," Princeton University Press (1995).
Johnson, "Optical Scanners," Microwave Scanning Antennas, vol. 1, p. 251-261, (1964).
Kim et al., "Control of Optical Transmission Through Metals Perforated With Subwavelength Hole Arrays," Optic Letters, vol. 24, No. 4, pp. 256-257, (Feb. 1999).
Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).
Lee et al., "The Surface/Bulk Micromachining (SBM) Process: A New Method for Fabricating Released MEMS in Single Crystal Silicon", Journal of Microelectromechanical Systems, vol. 8, Issue 4, pp. 409-416, (Dec. 1999).
Light over Matter, Circle No. 36 (Jun. 1993).
Lin et al., "Free-Space Micromachined Optical Switches for Optical Networking," IEEE Journal of Selected Topics in Quantum Electronics, vol. 5, No. 1, pp. 4-9. (Jan./Feb. 1999).
Little et al., "Vertically Coupled Microring Resonator Channel Dropping Filter," IEEE Photonics Technology Letters, vol. 11, No. 2, (1999).
Magel, "Integrated Optic Devices Using Micromachined Metal Membranes," SPIE vol. 2686, 0-8194-2060-Mar. (1996).
Miles, Mark, W., "A New Reflective FPD Technology Using Interferometric Modulation," The Proceedings of the Society for Information Display (May 11-16, 1997).
Nagami et al., "Plastic Cell Architecture: Towards Reconfigurable Computing For General-Purpose," IEEE, 0-8186-8900-, pp. 68-77, (May 1998).
Newsbreaks, "Quantum-trench devices might operate at terahertz frequencies," Laser Focus World (May 1993).
Oliner et al., "Radiating Elements and Mutual Coupling," Microwave Scanning Antennas, vol. 2, pp. 131-141, (1966).
PCT/US02/13442, Search Report Sep. 13, 2002.
PCT/US04/20330 Search Report Nov. 8, 2004.
PCT/US05/029821 International Search Report (Dec. 27, 2005).

PCT/US05/030927 International Search Report (Jan. 25, 2006).
PCT/US05/032331 International Search Report (Apr. 7, 2006).
PCT/US05/033558 Partial International Search Report (Feb. 24, 2006).
PCT/US2004/035820 International Search Report and Written Opinion (Apr. 11, 2005).
Raley et al., "A Fabry-Perot Microinterferometer for Visible Wavelengths," IEEE Solid-State Sensor and Actuator Workshop, Jun. 1992, Hilton Head, SC.
Schnakenberg et al., "TMAHW Etchants for Silicon Micromachining," 1991 International Conference on Solid State Sensors and Actuators-Digest of Technical Papers, pp. 815-818 (1991).
Sperger et al., "High Performance Patterned All-Dielectric Interference Colour Filter for Display Applications," SID Digest, pp. 81-83, (1994).
Sridharan et al. "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.
Stone, "Radiation and Optics, An Introduction to the Classical Theory," McGraw-Hill, pp. 340-343, (1963).
Walker et al., "Electron-beam-tunable Interference Filter Spatial Light Modulator," Optics Letters vol. 13, No. 5, pp. 345-347, (May 1988).
Williams et al., "Etch Rates for Micromachining Processing," Journal of Microelectromechanical Systems, vol. 5, No. 4, pp. 256-259 (Dec. 1996).
Winters et al., "The etching of silicon with XeF2 vapor. Applied Physics Letters," vol. 34, No. 1, pp. 70-73 (Jan. 1979).
Winton, "A novel way to capture solar energy," Chemical Week, (May 1985).
Wu, "Design of a Reflective Color LCD Using Optical Interference Reflectors," ASIA Display '95, pp. 929-931, (Oct. 1995).
Zhou et al., "Waveguide Panel Display Using Electromechanical Spatial Modulators" SID Digest, vol. XXIX, (1998).
Chiou et al., "A Novel Capacitance Control Design of Tunable Capacitor Using Multiple Electrostatic Driving Electrodes," IEEE NANO 2001, M 3.1, Nanoelectronics and Giga-Scale Systems (Special Session), Oct. 29, 2001, pp. 319-324.
Fork, et al., "P-67: Chip on Glass Bonding using StressedMetal™ Technology" Sid 05 Digest, May 24, 2005.
RCO Pt Pub 157313, May 1, 1991, FSI International.
Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).
Austrian Search Report for EX72/2005 dated May 13, 2005.
Austrian Search Report for EX81/2005 dated May 18, 2005.
Austrian Search Report for EX170/2005 dated Jul. 6, 2005.
Austrian Search Report for EX139/2005 dated Jul. 27, 2005.
Austrian Search Report for EX144/2005 dated Aug. 11, 2005.
Bains, "Digital Paper Display Technology Holds Promise For Portables," CommsDesign EE Times (2000).
Bass, Handbook of Optics, vol. 1, Fundamentals, Techniques, and Design, Second Edition, McGraw-Hill, inc. New York pp. 2.29/2.36 (1995).
Chu, et al. "Formation and Microstructures of Anodic Aluminoa Films from Aluminum Sputtered onglass Substrate" Journal of the Electrochemical Society, 149 (7) B321-B327 (2002).
Crouse, "Self-ordered pore structure of anodized aluminum on silicon and pattern transfer" Applied Physics Letters, vol. 76, No. 1, Jan. 3, 2000. pp. 49-51.
French, P.J. "Development of Surface Micromachining techniques compatable with on-chip electronics" Journal of Micromechanics and Microengineering vol. 6 No. 2, 197-211 XP 002360789 Jun. 1996 IOP Publishing.
Furneaux, et al. "The Formation of Controlled-porosity membranes from Anodically Oxidized Aluminium" Nature vo 337 Jan. 12, 1989, pp. 147-149.
Jerman J. H. et al., "Maniature Fabry-Perot Interferometers Micromachined in Silicon for Use in Optical Fiber WDM Systems," Transducers. San Francisco, Jun. 24-27, 1991, Proceedings of the Internatioal Conference on Solid State Sensors Andactuators, New Youk IEEE, US, vol. Conf. 6, Jun. 24, 1991.
Lieberman, "MEMS Display Looks to Give PDAs Sharper Image," EE Times (Feb. 11, 1997).
Lieberman, "Microbridges at Heart of New MEMS Displays," EE Times (Apr. 24, 1997).
Maboudian, et al. Critical Review: Adhesion in Surface Micromechanical Structures: J. Vac. Sci Techno. B 15(1) Jan./Feb. 1997, pp. 1-20.
Microchem, LOR Lift-Off Resists Datasheet, 2002.
Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).
Miles, et al., "10.1: Digital Paper for Reflective Displays," 2002 SID International Symposium Digest of Technical Papers, Boston, MA, SID International Symposium Digest of Technical Papers, San Jose, CA, vol. 33 / 1, pp. 115-117 (May 21-23, 2002).
Science and Technology, The Economist, pp. 89-90, (May 1999).
Search Report and Written Opinion for PCT/US05/33558 (May 19, 2005).
Search Report PCT/US05/032331 (Apr. 7, 2006).
Search Report PCT/US05/032331 (Jan. 9, 2006).
Search Report and written opinion PCT/US05/032647.
Tayebi et al. "Reducing the Effects of adhesion and friction in microelectomechanical systesm (MEMS) through surface roughening: Comparision Between theory and experiments" http://jap.ajp.org/jap/copyright.isp Journal of applied Physics 98, 073528 (2005).
Thin Film Transistors- Materials and Processes -vol. 1 Amorphous Silicon Thin Film Transistors ed. Yue Kuo, Kluwer Academic Publishers, Boston (2004).
Xactix Xetch X Specifications, http://xactix.com/Xtech X3specs.htm. Jan. 5, 2005.
EPO Communication for European Patent Application No. 05 775 273.5 dated Jun. 1, 2007.

* cited by examiner

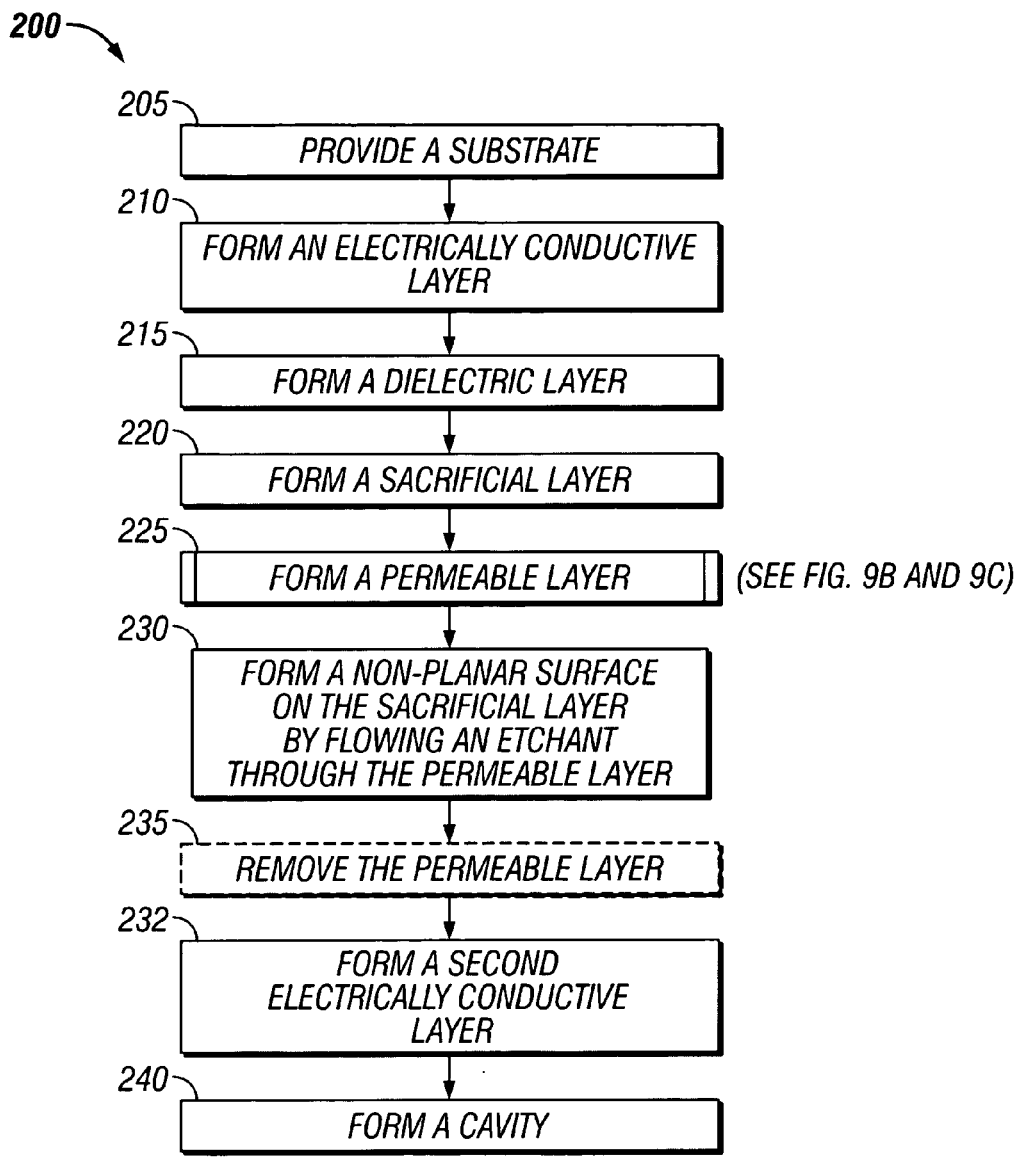
FIG. 9A
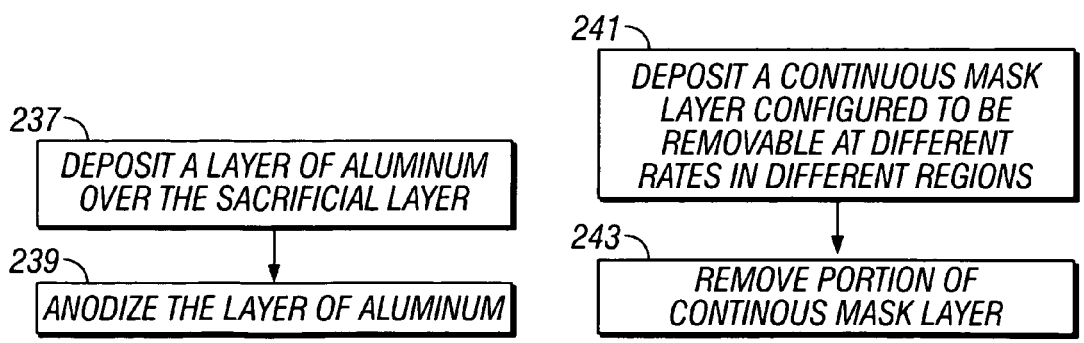
FIG. 9B
FIG. 9C

NON-PLANAR SURFACE STRUCTURES AND PROCESS FOR MICROELECTROMECHANICAL SYSTEMS

CROSS-REFERENCE TO RELATED APPLICATIONS

This application is related to U.S. application Ser. No. 11/189,690, filed Jul. 26, 2005 entitled SYSTEM AND METHOD FOR MICRO-ELECTROMECHANICAL OPERATION OF AN INTERFEROMETRIC MODULATOR; NON-PLANAR SURFACE STRUCTURES AND PROCESS FOR MICROELECTROMECHANICAL SYSTEMS; NON-PLANAR SURFACE STRUCTURES AND PROCESS FOR MICROELECTROMECHANICAL SYSTEMS (application Ser. No. 11/406,981, filed on even date herewith); MICROELECTROMECHANICAL DEVICE AND METHOD UTILIZING NANOPARTICLES (application Ser. No. 11/407,730, filed on even date herewith); and MICROELECTROMECHANICAL DEVICE AND METHOD UTILIZING A POROUS SURFACE (application Ser. No. 11/407,470, filed on even date herewith).

BACKGROUND OF THE INVENTION

1. Field of the Invention

This invention relates to microelectromechanical systems. More particularly, this invention relates to methods and apparatus for improving the performance of microelectromechanical systems such as interferometric modulators.

2. Description of the Related Art

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

An embodiment provides a method of making a microelectromechanical system (MEMS) device that includes forming a permeable layer over an underlying layer material, wherein the permeable layer comprises a masking material more resistant to removal by an etchant than the underlying layer material. The method further includes removing a portion of the underlying layer material by flowing the etchant through the permeable layer, thereby forming a non-planar surface on the remaining lower layer material, and depositing an overlying layer over the non-planer surface formed on the underlying layer to form a non-planar interface between the underlying layer and the overlying layer.

An embodiment provides a method of making a microelectromechanical system (MEMS) device that includes providing a substrate, depositing a sacrificial material over at least a portion of the substrate, the sacrificial material being removable by a first etchant, and forming a permeable layer over the sacrificial material, wherein the permeable layer comprises a masking material more resistant to removal by the first etchant than the sacrificial material. The method further includes removing a portion of the sacrificial material by flowing the first etchant through the permeable layer, thereby forming a non-planar surface on the remaining sacrificial material, and forming an electrically conductive layer over at least a portion of the non-planar surface.

Another embodiment provides a method of making an interferometric modulator that includes providing a substrate, depositing a first electrically conductive layer over at least a portion of the substrate, depositing a sacrificial material over at least a portion of the first electrically conductive layer, the sacrificial material being removable by an etchant, and forming a permeable layer over the sacrificial material, wherein the permeable layer comprises a masking material. The method further comprises removing a portion of the sacrificial material by flowing the etchant through the permeable layer, thereby forming a non-planar surface on the sacrificial material, and forming a second electrically conductive layer over at least a portion of the non-planar surface. Another embodiment provides an unreleased interferometric modulator made by such a method.

Another embodiment provides an unreleased MEMS device that includes a substrate, a first electrically conductive layer over at least a portion of the substrate, and a sacrificial layer over at least a portion of the first electrically conductive layer, the sacrificial layer comprising a material removable by an etchant, wherein the sacrificial layer comprises a non-planar surface. The MEMS device further includes a permeable layer over the non-planar surface of the sacrificial layer, wherein the permeable layer comprises a masking material more resistant to removal by the etchant than the sacrificial layer material, and a second electrically conductive layer over at least a portion of the permeable layer.

Another embodiment provides an interferometric modulator that includes a substrate, a first electrically conductive layer over at least a portion of the substrate, a second electrically conductive layer separated from the first electrically conductive layer by a cavity, wherein the second electrically conductive layer comprises a non-planar surface layer facing the substrate, and where surface asperities on the non-planar surface exhibit a skewness greater than about zero. The interferometric modulator further includes a support structure arranged over the substrate and configured to support the second electrically conductive layer.

BRIEF DESCRIPTION OF THE DRAWINGS

FIGS. 9A, 9B and 9C are flow diagrams illustrating an embodiment of a method of making a MEMS device.

The Figures are not drawn to scale.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

An embodiment provides methods of making interferometric modulators with decreased contact area between a movable surface and another surface so as to reduce adhesion forces between the two surfaces. In some embodiments, the methods involve forming a non-planar surface on a sacrificial layer and/or some other layer, by flowing an etchant through a permeable so as to remove a portion of the sacrificial layer and/or a dielectric layer beneath the permeable layer.

Figure 1:
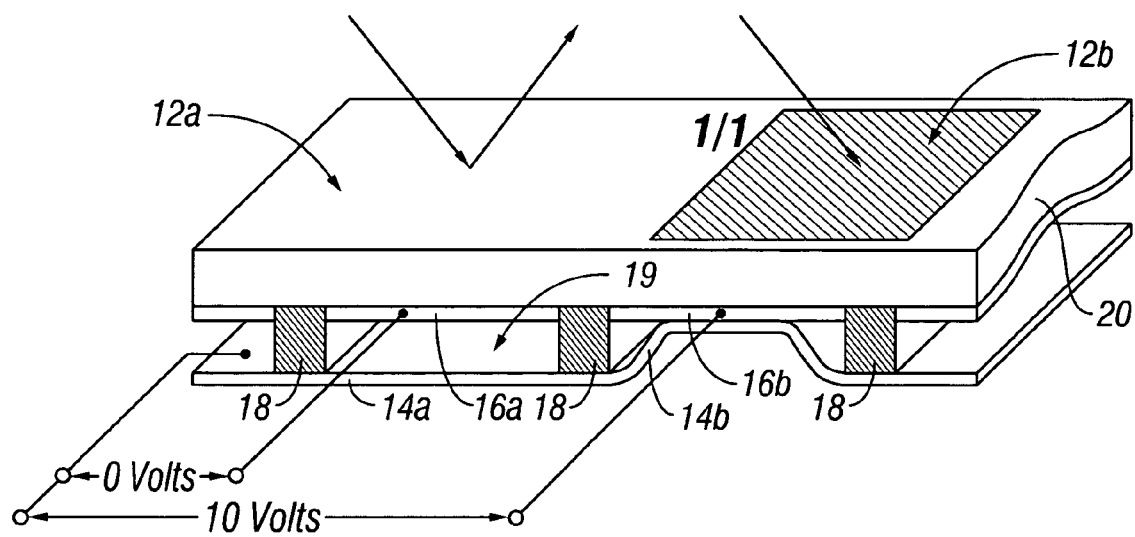
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
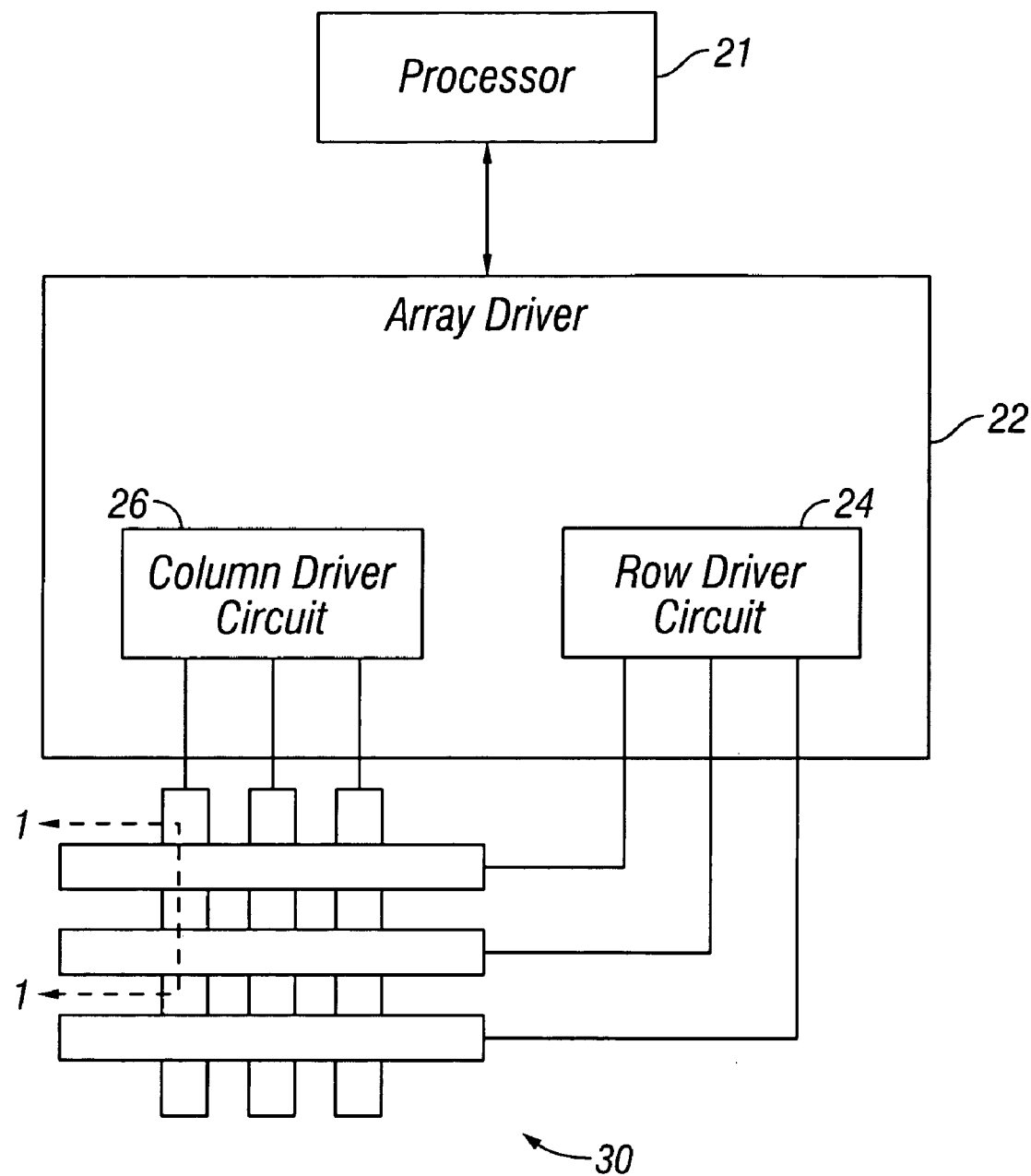
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
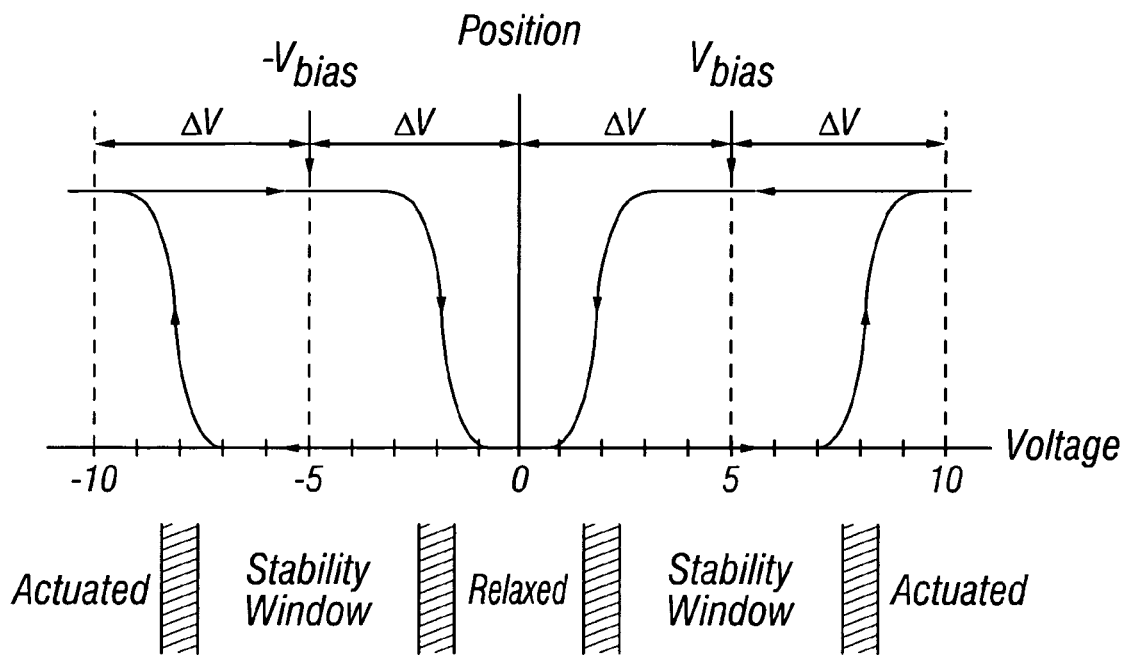
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
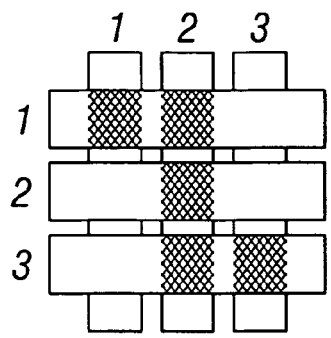
FIG. 5A illustrates one exemplary frame of display data in the 3×3 interferometric modulator display of FIG. 2.
Figure 5B:
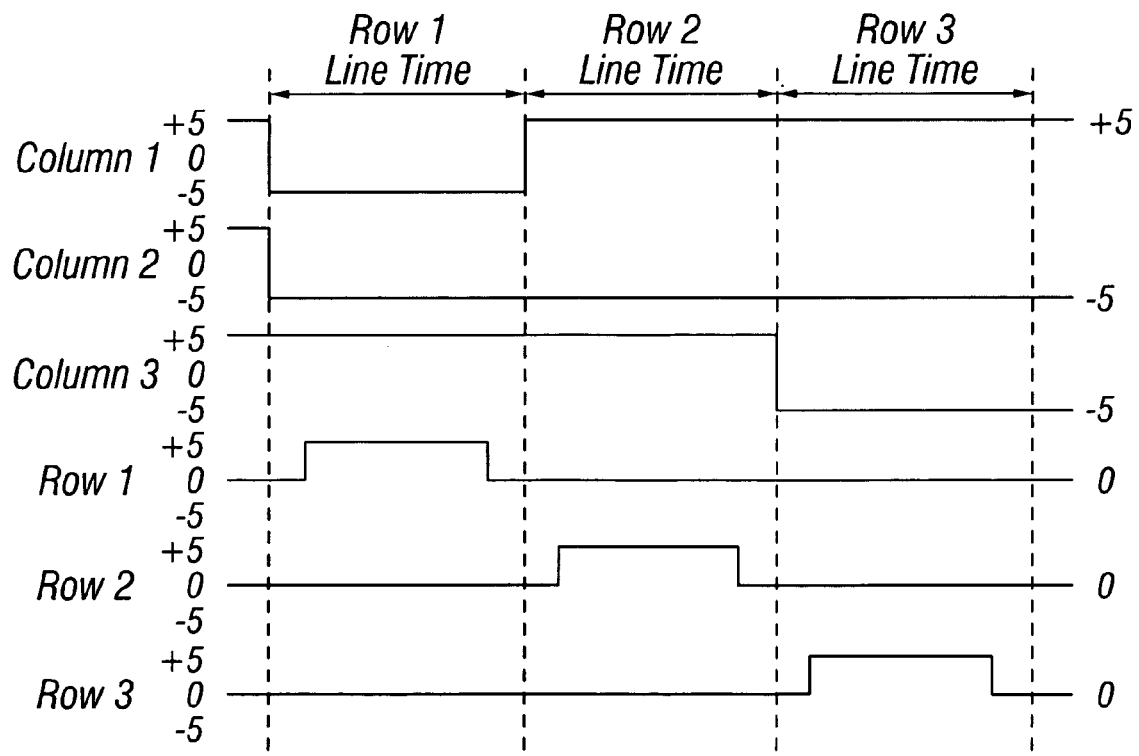
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
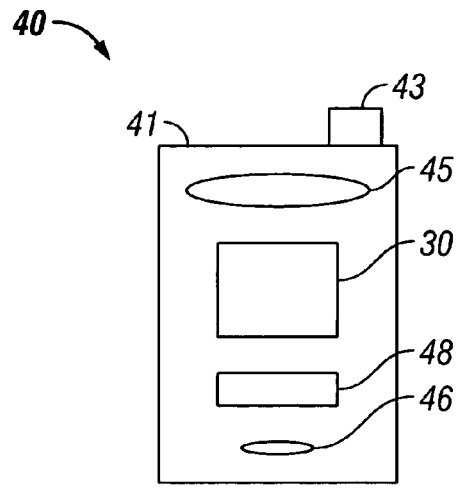
FIGS. 6A and 6B are system block diagrams illustrating an embodiment of a visual display device comprising a plurality of interferometric modulators.
Figure 6B:
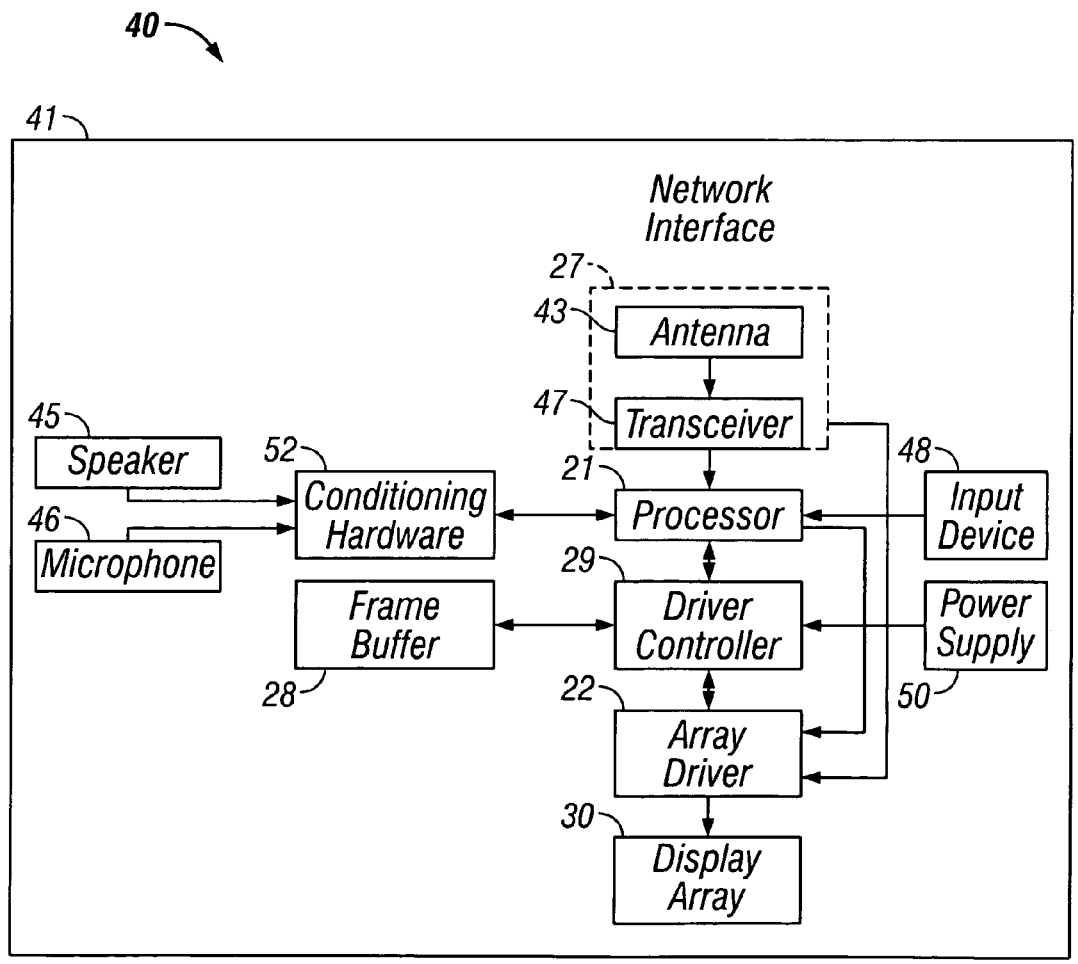

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a memory device such as a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
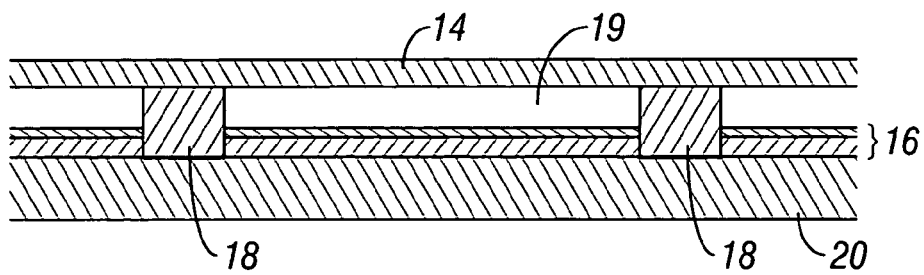
FIG. 7A is a cross section of the device of FIG. 1.
Figure 7B:
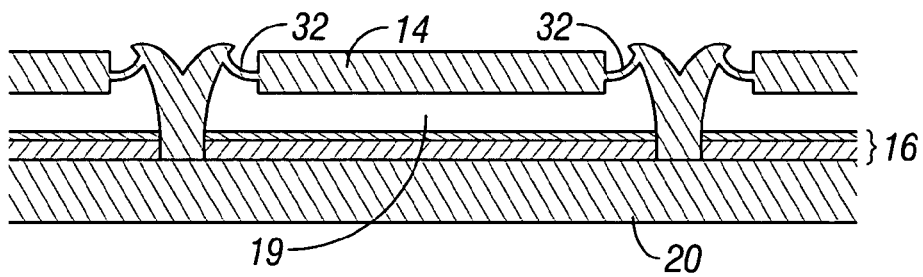
FIG. 7B is a cross section of an alternative embodiment of an interferometric modulator.
Figure 7C:
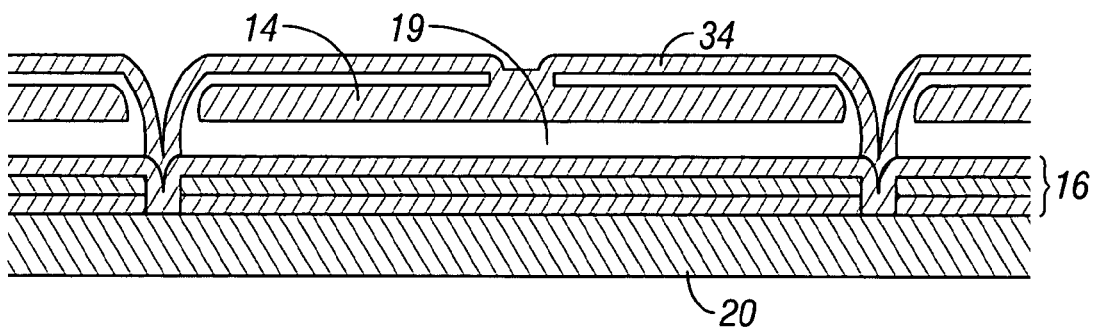
FIG. 7C is a cross section of another alternative embodiment of an interferometric modulator.
Figure 7D:
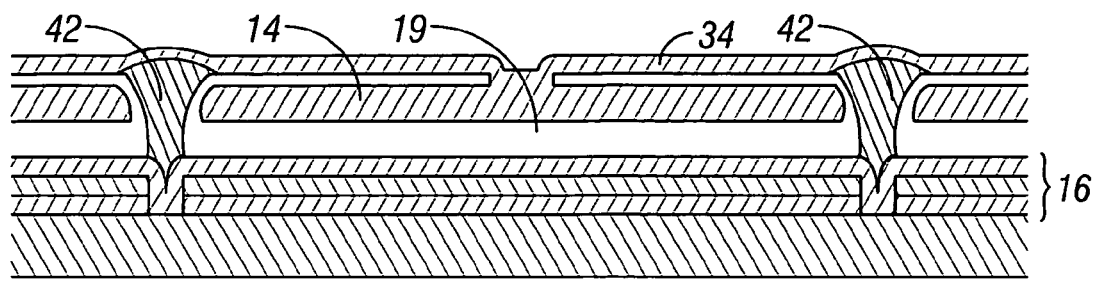
FIG. 7D is a cross section of yet another alternative embodiment of an interferometric modulator.
Figure 7E:
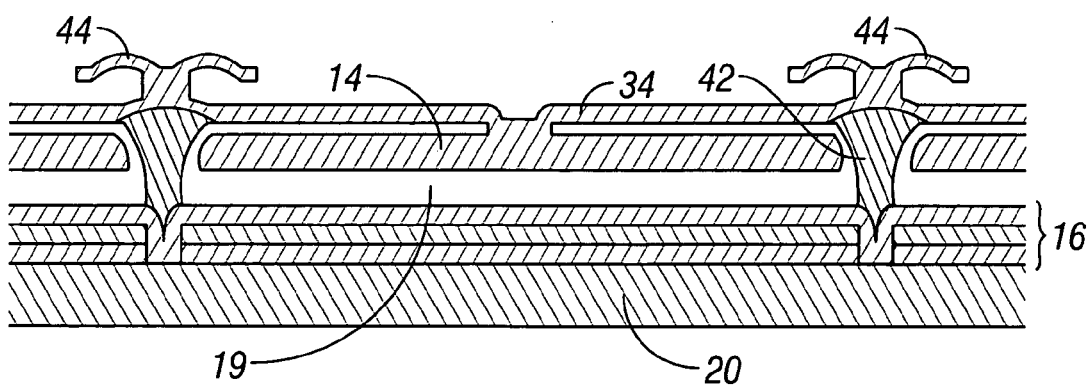
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8:
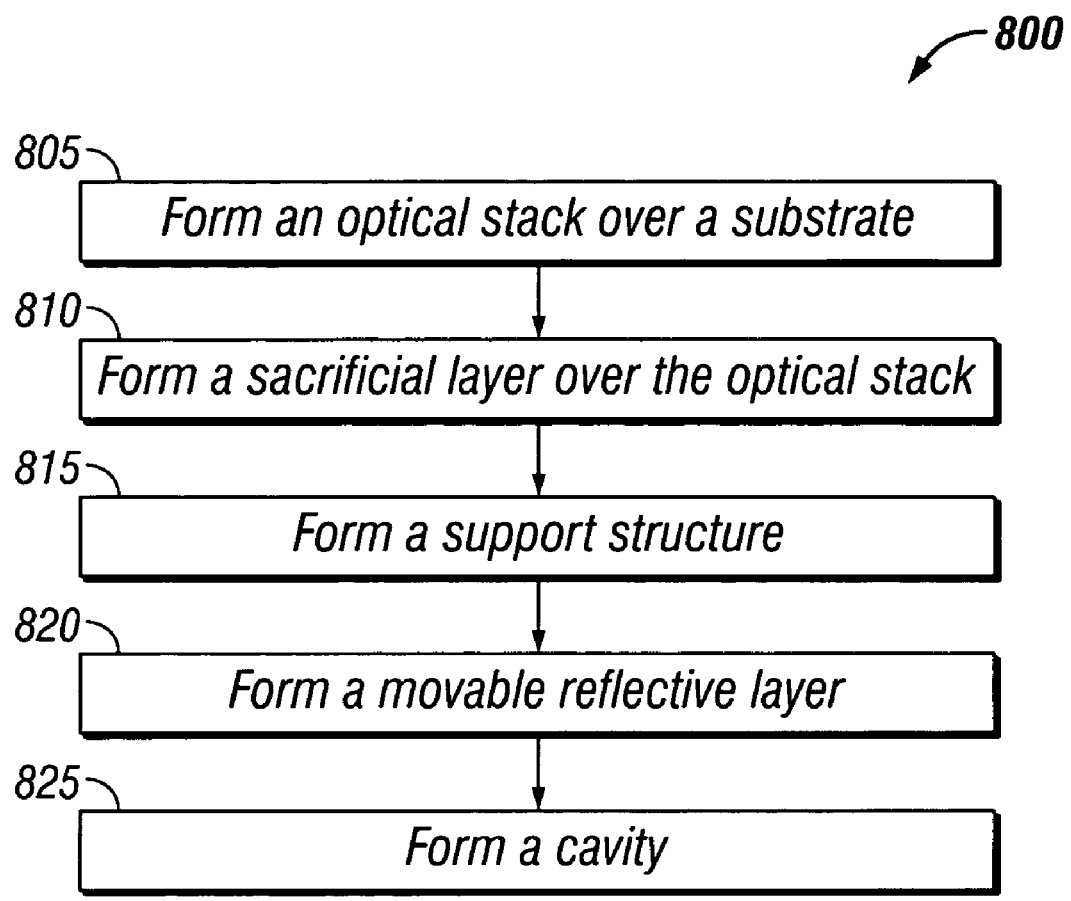
FIG. 8 is a flow diagram illustrating certain steps in an embodiment of a method of making an interferometric modulator.

FIG. 8 illustrates certain steps in an embodiment of a manufacturing process 800 for an interferometric modulator. Such steps may be present in a process for manufacturing, e.g., interferometric modulators of the general type illustrated in FIGS. 1 and 7, along with other steps not shown in FIG. 8. With reference to FIGS. 1, 7 and 8, the process 800 begins at step 805 with the formation of the optical stack 16 over the substrate 20. The substrate 20 may be a transparent substrate such as glass or plastic and may have been subjected to prior preparation step(s), e.g., cleaning, to facilitate efficient formation of the optical stack 16. As discussed above, the optical stack 16 is electrically conductive, partially transparent and partially reflective, and may be fabricated, for example, by depositing one or more of the layers onto the transparent substrate 20. In some embodiments, the layers are patterned into parallel strips, and may form row electrodes in a display device. In some embodiments, the optical stack 16 includes an insulating or dielectric layer that is deposited over one or more metal layers (e.g., reflective and/or conductive layers).

The process 800 illustrated in FIG. 8 continues at step 810 with the formation of a sacrificial layer over the optical stack 16. The sacrificial layer is later removed (e.g., at step 825) to form the cavity 19 as discussed below and thus the sacrificial layer is not shown in the resulting interferometric modulator 12 illustrated in FIG. 1. The formation of the sacrificial layer over the optical stack 16 may include deposition of a $XeF_2$-etchable material such as molybdenum or amorphous silicon, in a thickness selected to provide, after subsequent removal, a cavity 19 having the desired size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

The process 800 illustrated in FIG. 8 continues at step 815 with the formation of a support structure e.g., a post 18 as illustrated in FIGS. 1 and 7. The formation of the post 18 may include the steps of patterning the sacrificial layer to form a support structure aperture, then depositing a material (e.g., a polymer) into the aperture to form the post 18, using a deposition method such as PECVD, thermal CVD, or spin-coating. In some embodiments, the support structure aperture formed in the sacrificial layer extends through both the sacrificial layer and the optical stack 16 to the underlying substrate 20, so that the lower end of the post 18 contacts the substrate 20 as illustrated in FIG. 7A. In other embodiments, the aperture formed in the sacrificial layer extends through the sacrificial layer, but not through the optical stack 16. For example, FIG. 7D illustrates the lower end of the support post plugs 42 in contact with the optical stack 16.

The process 800 illustrated in FIG. 8 continues at step 820 with the formation of a movable reflective layer such as the movable reflective layer 14 illustrated in FIGS. 1 and 7. The movable reflective layer 14 may be formed by employing one or more deposition steps, e.g., reflective layer (e.g., aluminum, aluminum alloy) deposition, along with one or more patterning, masking, and/or etching steps. As discussed above, the movable reflective layer 14 is typically electrically conductive, and may be referred to herein as an electrically conductive layer. Since the sacrificial layer is still present in the partially fabricated interferometric modulator formed at step 820 of the process 800, the movable reflective layer 14 is typically not movable at this stage. A partially fabricated interferometric modulator that contains a sacrificial layer may be referred to herein as an "unreleased" interferometric modulator.

The process 800 illustrated in FIG. 8 continues at step 825 with the formation of a cavity, e.g., a cavity 19 as illustrated in FIGS. 1 and 7. The cavity 19 may be formed by exposing the sacrificial material (deposited at step 810) to an etchant. For example, an etchable sacrificial material such as molybdenum or amorphous silicon may be removed by dry chemical etching, e.g., by exposing the sacrificial layer to a gaseous or vaporous etchant, such as vapors derived from solid xenon difluoride ($XeF_2$) for a period of time that is effective to remove the desired amount of material, typically selectively relative to the structures surrounding the cavity 19. Other etching methods, e.g. wet etching and/or plasma etching, may also be used. Since the sacrificial layer is removed during step 825 of the process 800, the movable reflective layer 14 is typically movable after this stage. After removal of the sacrificial material, the resulting fully or partially fabricated interferometric modulator may be referred to herein as a "released" interferometric modulator.

The performance of MEMS devices in general and interferometric modulators in particular, may be adversely affected by a condition known in the art as stiction. With reference to FIG. 1, stiction can cause, for example, the actuated movable layer 14b to remain in contact with the optical stack 16b, even in the presence of a restoring force that would be expected to return the movable layer 14b to the non-actuated position. Stiction occurs when the total of several adhesion forces, arising from a various adhesion mechanisms, are greater than the restoring force. The restoring force comprises the combined mechanical tensile stresses in the actuated movable layer. Since surface forces become more significant with decreasing device dimensions, and restoring forces shrink with decreasing device dimensions, stiction can be a concern for MEMS devices including interferometric modulators.

Adhesion forces may arise from several mechanisms including, for example, capillary forces, van der Waals interactions, chemical bonds and trapped charges. Adhesion forces due to all of these mechanisms, in varying degrees, depend on the contact area and surface separation between the various movable and stationary layers when in the actuated state. Embodiments provide methods of manufacturing MEMS devices with lower contact area and/or larger surface separation, thereby resulting in lower adhesion forces and more favorable performance due to less stiction.

In general, the methods include forming a permeable layer over an underlying layer. The permeable layer comprises a masking material more resistant to removal by an etchant than the underlying layer material. The method further includes removing a portion of the underlying layer material by flowing the etchant through the permeable layer, thereby forming a non-planar surface on the remaining lower layer material. The method further includes depositing an overlying layer over the non-planer surface formed on the underlying layer to form a non-planar interface between the underlying layer and the overlying layer. An example of such a process is shown in FIGS. 9 and 10. In this example, the underlying layer comprises a sacrificial material and the overlying layer comprises an electrically conductive layer (e.g., a movable reflective layer of an interferometric modulator). However, it will be understood by those of skill in the art that other layers may function as the underlying and/or overlying layers between which the non-planar interface is formed.

FIG. 9A is a flow diagram illustrating certain steps in an embodiment of a method of making a MEMS device. Such steps may be present in a process for manufacturing, e.g., interferometric modulators of the general type illustrated in FIGS. 1 and 7, along with other steps not shown in FIG. 9A. FIGS. 10A through 10G schematically illustrate an embodiment of a method for fabricating a MEMS device using conventional semiconductor manufacturing techniques such as photolithography, deposition, masking, etching (e.g., dry methods such as plasma etch and wet methods), etc. Deposition includes "dry" methods such as CVD (including plasma-enhanced CVD and thermal CVD) and sputter coating, and wet methods such as spin coating. With reference to FIGS. 9 and 10, the process 200 begins at step 205 where a substrate 100 is provided. In one embodiment, the substrate 100 may comprise any transparent material such as glass or plastic.

Figure 10A:
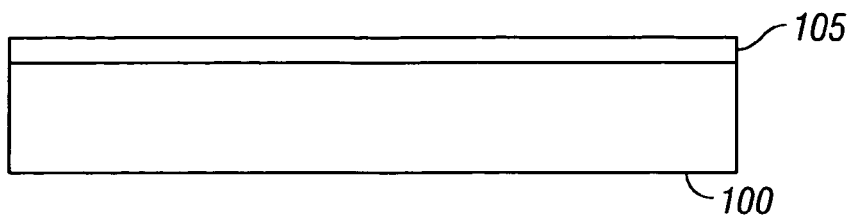
FIGS. 10A through 10G schematically illustrate an embodiment of a method for fabricating a MEMS device.

The process 200 continues at step 210 with the formation of a first electrically conductive layer 105 on the substrate 100 as shown in FIG. 10A. The first electrically conductive layer 105 can be a single layer structure or multiple sub-layer structure as described above. In a single layer structure where the layer 105 functions as both electrode and mirror, the layer 105 is formed by deposition of an electrically conductive material on the substrate 100. The first electrically conductive layer 105 may be formed into electrodes through subsequent patterning and etching steps not shown in FIG. 9A or 10. The first electrically conductive layer 105 may be a metal or a semiconductor (such as silicon) doped to have the desired conductivity. In one embodiment (not shown in FIG. 10), the first electrically conductive layer 105 is a multilayer structure comprising a transparent conductor (such as indium tin oxide) and a primary mirror or partially reflective layer (such as chromium).

Figure 10B:
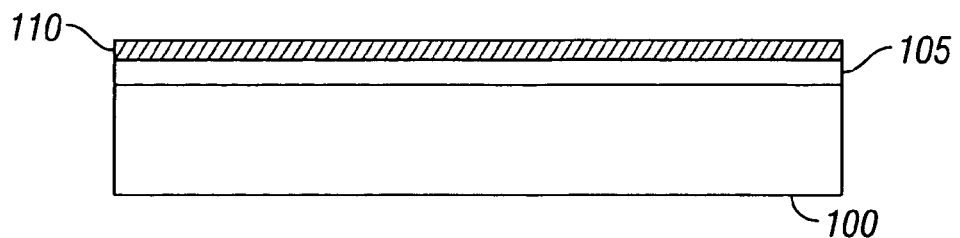

The process 200 continues at step 215 with the formation of a dielectric layer 110 over at least a portion of the electrically conductive layer 105 as shown in FIG. 10B. The dielectric layer 110 may comprise insulating materials such as silicon oxide and/or aluminum oxide. The dielectric layer 110 serves to insulate the first electrically conductive layer 105 from an electrically conductive movable layer (such as movable layer 14 of FIGS. 1 and 7) in an interferometric modulator. The dielectric layer 110 may be formed by known deposition methods, preferably CVD.

Figure 10C:
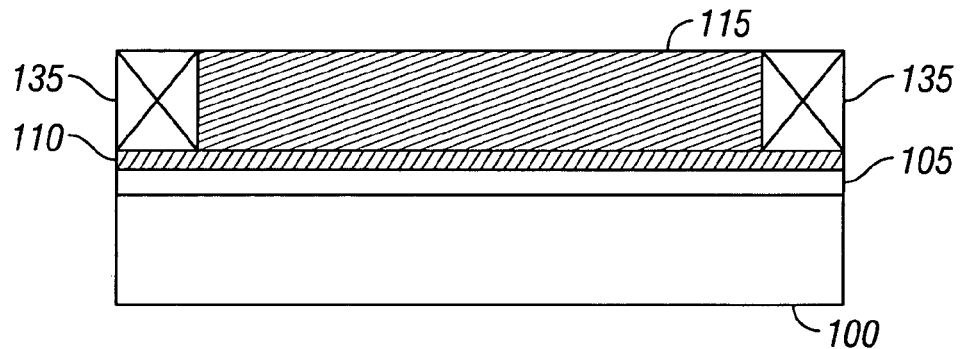

The process 200 continues at step 220 with the formation of a sacrificial layer 115 as shown in FIG. 10C. The sacrificial layer 115 may comprise a material etchable by $XeF_2$, preferably molybdenum. Deposition methods such as CVD, sputtering or spin coating may be used in forming the sacrificial layer 115. In an embodiment of an interferometric modulator, the sacrificial layer is deposited so as to form, upon subsequent removal, an interferometric cavity with a thickness in the range of about 1000 angstroms to about 5000 angstroms between the movable layer 14 and the optical stack 16 of FIGS. 1 and 7.

In the embodiment shown in FIG. 10C, the sacrificial layer 115 is patterned and etched (a step not shown in FIG. 9A) to form one or more structure apertures (not shown in FIG. 10) in which support structure material is deposited resulting in support structures 135, as shown in FIG. 10C. The support structures 135 may comprise a non-conductive material. In other embodiments, patterning and etching of the sacrificial layer 115, to form structure apertures, may occur after deposition of a permeable layer 125 (see step 225 below), formation of a non-planar surface 130 (see step 230 below), and/or removal of the permeable layer (see step 235 below) at least in the structure aperture locations. In other embodiments, deposition of the support structure material into the formed structure apertures may occur after deposition of the permeable layer 125 (see step 225 below), formation of the non-planar surface 130 (see step 230 below), and/or removal of the permeable layer (see step 235 below). If the permeable layer 115 comprises an oxide of aluminum and the dielectric layer 110 also comprises an oxide of aluminum, then the dielectric layer 110 can be etched as well as the permeable layer in the areas where the structure apertures are located.

Figure 10D:
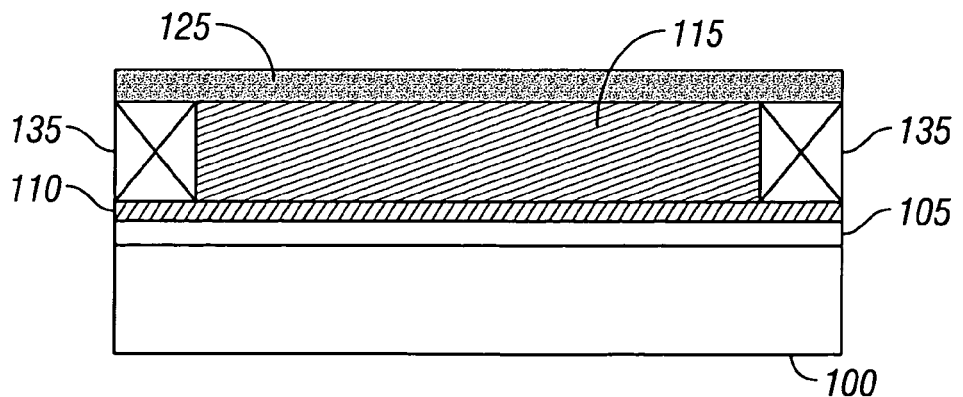

The process 200 continues at step 225 with the formation of a permeable layer 125 over the sacrificial layer 115 and, in the illustrated embodiment, over the support structures 135 as shown in FIG. 10D. In an embodiment, the permeable layer 125 is preferably a discontinuous layer covering at least a portion of the sacrificial layer 115. The permeable layer 125 may be formed by flash deposition using CVD, PVD e.g., short term sputtering, or by image transfer, preferably electron beam lithography. In one embodiment, the permeable layer 125 comprises a masking material that is more resistant to removal by an etchant than the sacrificial layer 115. In one embodiment, the permeable layer 125 comprises a material that can be selectively etched against the sacrificial layer 115. In a preferred embodiment, the permeable layer comprises aluminum (e.g., an oxide of aluminum), and the sacrificial layer 115 comprises molybdenum. In a preferred embodiment, the permeable layer 125 is deposited at a thickness of about 10 angstroms to about 30 angstroms.

Figure 11A:
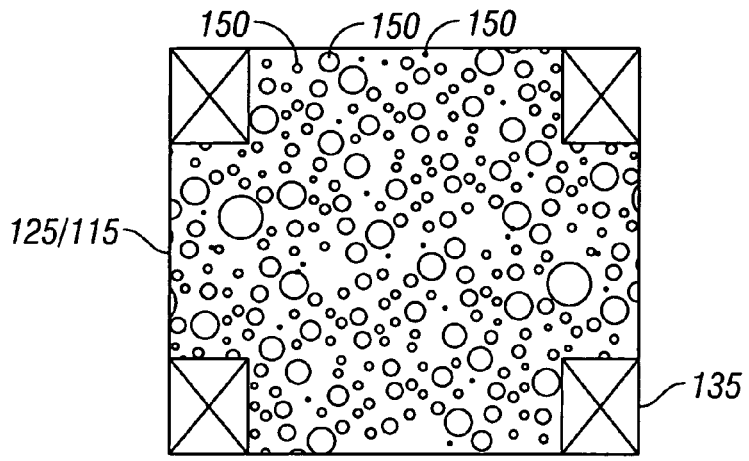
FIGS. 11A, 11B and 11C are top cross sectional views of alternative embodiments of permeable layer formations.
Figure 11B:
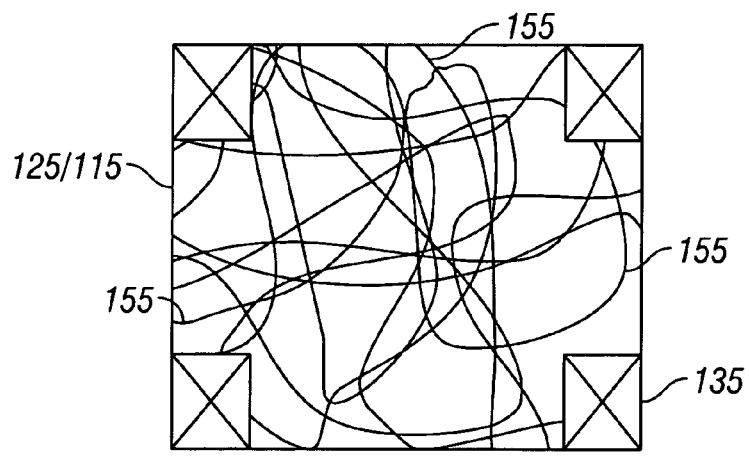

FIGS. 11A and 11B show top cross sectional views of alternative embodiments of permeable layer formations that may be obtained using one or more techniques such as flash deposition, short term sputtering and/or electron beam lithography in forming the permeable layer 125 over the sacrificial layer 115. In FIG. 11A, the permeable layer 125 over the sacrificial layer 115 comprises individual islands (or pimples) 150 that may be formed using flash deposition or short term sputtering. In some embodiments, the islands 150 may contact each other, but at least some of the underlying sacrificial layer 115 should be uncovered. The duration and/or quantity of material deposited is preferably limited such that spaces (discontinuities) exist between at least some of the islands 150. The distance between islands 150 may be chosen to achieve the desired non-planar surface characteristics that are described below. Depending on the material being deposited and the deposition conditions, the time of the deposition and/or the quantity of material deposited to achieve the desired coverage may vary, as determined by routine experimentation. In a preferred embodiment, the percentage of the sacrificial material covered by the islands 150 is in a range of about 30% to about 70% coverage.

In FIG. 11B, the permeable layer 125 over the sacrificial layer 115 comprises a quasi-random pattern 155 that may be applied to the sacrificial layer 115. This pattern 155 may be applied using image transfer techniques such as electron beam lithography, x-ray lithography and ion-beam lithography. Also, applying nanotubes or other nano-type objects on the surface of the sacrificial layer 115 (e.g., by spin coating of a solution that comprises nanotubes) and using the nanotubes as the permeable layer 125 can produce random patterns. The distance between patterns 155 may be chosen to achieve the desired non-planar surface characteristics that are described below. In a preferred embodiment, the percentage of the sacrificial material covered by the patterns 155 is in a range of about 30% to about 70% coverage.

In another embodiment, the formation of the permeable layer 125 at step 225 comprises a process illustrated in FIG. 9B. At step 237, a continuous layer of aluminum is formed over at least a portion of the sacrificial layer 115. The continuous layer of aluminum is preferably about 300 angstroms to about 1000 angstroms thick. The aluminum layer may be deposited by known methods such as CVD or PVD.

Figure 11C:
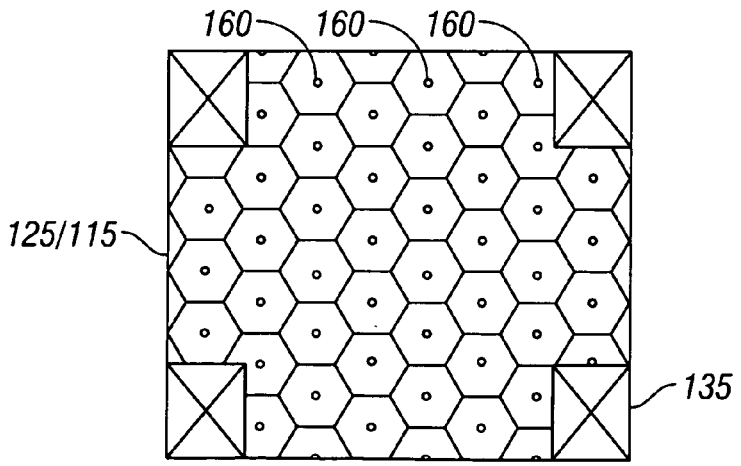

At step 239, the layer of aluminum is anodized, using known anodization processes, e.g., any of several electrochemical processes. The anodization process forms regularly spaced pores in the aluminum layer resulting in the formation of the permeable layer 125. The thickness of the aluminum layer is chosen such that the anodization at step 239 forms pores exposing the sacrificial layer 115. The thickness of the anoidized aluminum layer will vary depending on the anodization conditions employed at step 239. The pores formed at step 239 may measure about 10 angstroms to about several hundred angstroms across. FIG. 11C shows a top cross sectional view of pores 160 in an anodized aluminum permeable layer 125 that is formed over the sacrificial layer 115. The thickness of the starting aluminum layer and the anodization conditions may be chosen such that the pores 160 are of a diameter and density that result in the desired non-planar surface characteristics that are described below.

In another embodiment, the formation of the permeable layer 125 at step 225 comprises a process illustrated in FIG. 9C. At step 241, a continuous mask layer is formed over at least a portion of the sacrificial layer 115. The continuous mask layer is formed in such a way that it includes a plurality of regions that are configured to be removable (e.g., by etching) at different relative rates. A portion of the continuous mask layer is then removed at step 243, thereby forming the permeable layer 125. For example, the continuous mask layer may be configured to contain regions that are etchable by a particular etchant at an etch rate that is higher than other regions. Holes may be formed in such a continuous mask layer by exposing the faster-etching regions to the etchant. After the holes are formed, a non-planar surface 130 may be formed at step 230 by flowing an etchant through the holes. The etchant used to form the holes in the continuous mask layer at step 243 may be the same or different from the etchant used to remove the sacrificial layer 115 to form the non-planar surface 130 in step 230. Thus, steps 243 and 230 may be sequential or overlap. For example, steps 243 and 230 may be stages of a continuous etch where the first stage of the etch forms the holes in the continuous mask layer and a later stage of the etch forms the non-planar surface 130 in the sacrificial layer 115. If the sacrificial layer 115 is etched at a higher relative rate by the same etchant used to remove portions of the continuous mask, then the non-planar surface may form more quickly and have deeper contours as the holes continue to form in the mask layer. However, even if the sacrificial layer is removed at a similar rate or more slowly than the faster-etching regions of the mask layer, some roughening of the sacrificial layer surface will still occur resulting in the non-planar surface 130. Alternatively, portions of the continuous mask layer may be removed by a first etchant and the non-planar surface 130 may be formed by a second etchant.

A continuous mask layer comprising a plurality of regions configured to be removable at different relative rates may be formed in various ways, e.g., deposited by known methods such as CVD or PVD. In an embodiment, the continuous mask layer is configured to have thickness variations across the mask layer, resulting in thinner areas that are removable, e.g., by etching, while thicker areas remain. The valley regions may be removed more quickly simply because they are thinner, or the peaks and valleys may etch at different rates. In dry etch techniques, the etch rates at the peaks may be faster than the etch rates at the valleys. Alternatively, a wet etch may result in faster etch rates in the valleys than at the peaks.

The chemical composition of the continuous mask layer may be altered in selected regions in such a way that those regions are configured to be removable at different relative rates, e.g., chemically modified to be etched more quickly or more slowly. For example, the chemical composition of selected regions of the continuous mask layer may be modified by doping (e.g, by ion implantation). Treated regions etch more quickly (or more slowly) than untreated or less treated regions.

In another embodiment, the continuous mask layer is configured to contain grains and grain boundaries that are removable at different relative rates. For example, the continuous mask layer may exhibit grain boundaries as a result of the formation of crystalline islands that form in the early stages of deposition and then join together thereby forming grain boundaries. These grain boundaries may be shallow and/or less ordered, and thus may exhibit a faster etch rate than other non-grain boundary regions.

Preferably, the material of the continuous mask layer and the first and/or second etchant are selected in combination with one another to provide a mask layer having a plurality of regions configured to be removable at different relative rates. For example, for the continuous mask layers configured as described above, the first and/or second etchant are preferably selected in combination with the configuration of continuous mask layer to provide etch selectivity between, e.g., regions having different compositions, regions having different thicknesses and/or between grains and grain boundary regions. Routine experimentation, informed by the teachings provided herein, may be used to identify suitable combinations of etchants and continuous mask layer configurations to provide a mask layer having a plurality of regions configured to be removable at different relative rates.

In an embodiment, the permeable layer 125 is formed using one or more non-lithographic methods as discussed above, e.g., flash deposition, short term sputtering, applying nanotubes or other random nano-type objects (e.g., by spin coating of a solution that comprises nanotubes), and/or aluminum deposition/anodization. This embodiment is beneficial since it negates the need for a lithographic step.

Figure 10E:
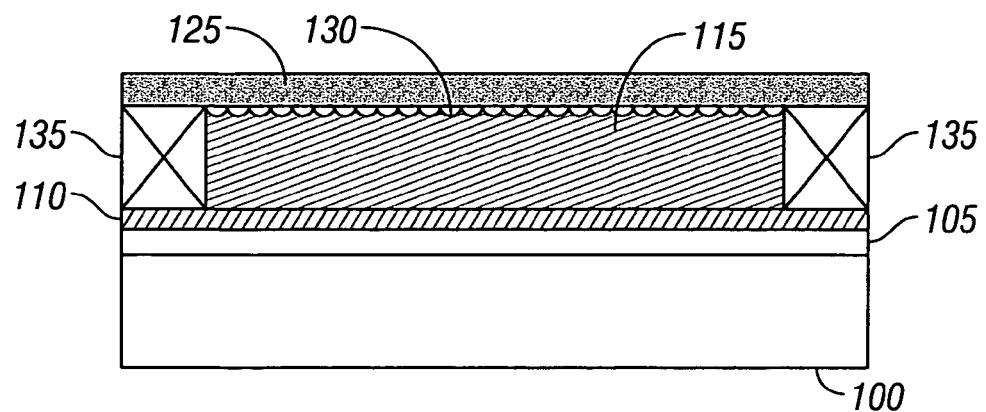

Returning to FIG. 9A, the process 200 continues at step 230 with the formation of a non-planar surface 130 on the sacrificial layer 115 as shown in FIG. 10E. The non-planar surface 130 may be formed by flowing an etchant through the pores or discontinuities in the permeable layer 125. In a preferred embodiment, the etch is a dry etch using a fluorine based plasma, and the duration of the etch is limited to allow removal of about 20 angstroms to about 50 angstroms of the sacrificial layer 115. Details of the dimensions and characteristics of the non-planar surface 130 formed at step 230 will be discussed below. In one embodiment, a substantial portion (e.g., greater than 50%) of the permeable layer is removed while flowing the etchant through the permeable layer.

In one embodiment, the process 200 continues at optional step 235 with removal of substantially all of the permeable layer 125. This removal is preferably done by selectively etching the permeable layer 125 against the sacrificial layer 115.

Figure 10F:
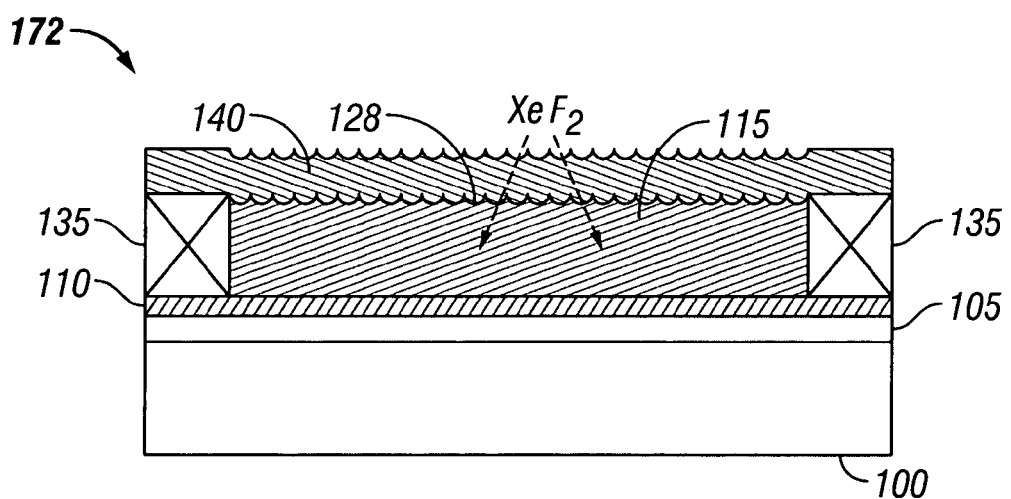

The process 200 continues at step 232 with the formation of a second electrically conductive layer 140 over the sacrificial layer 115 and, in the illustrated embodiment, over the support structures 135. Due to the presence of the non-planar surface 130 formed on the sacrificial layer 115, a non-planar interface 128, as shown in FIG. 10F, is formed between the sacrificial layer 115 and the second electrically conductive layer 140. In the illustrated embodiment of FIG. 10F, the optional step 235 of removing the permeable layer 125 has been conducted, so that the non-planar interface 128 is between the sacrificial layer 115 and the second electrically conductive layer 140. In one embodiment, the second electrically conductive layer comprises a movable layer such as the movable layer 14 of an interferometric modulator as shown in FIGS. 1 and 7. Since the sacrificial layer 115 is still present at this stage of the process 200, the movable layer is typically not yet movable. A partially fabricated MEMS device 172, e.g. a partially fabricated interferometric modulator, that contains a sacrificial layer (the layer 115 in this embodiment) may be referred to herein as an "unreleased" MEMS device. The second electrically conductive layer 140 may comprise a metal (e.g. aluminum or aluminum alloy). Forming the second electrically conductive layer 140 in step 232 may include one or more deposition steps as well as one or more patterning or masking steps. In an embodiment (not illustrated), at least a portion of the permeable layer 125 remains to become part of the second electrically conductive layer 140. Leaving the permeable layer may provide more support or stiffness to surface asperities of a non-planar surface formed on the second electrically conductive layer 140 after removal of the sacrificial layer 115 (see step 240 below). Thus, the non-planar interface 128 may be between the sacrificial layer 115 and the remaining portion of the permeable layer 125 on the underside of the second electrically conductive layer 140.

Figure 10G:
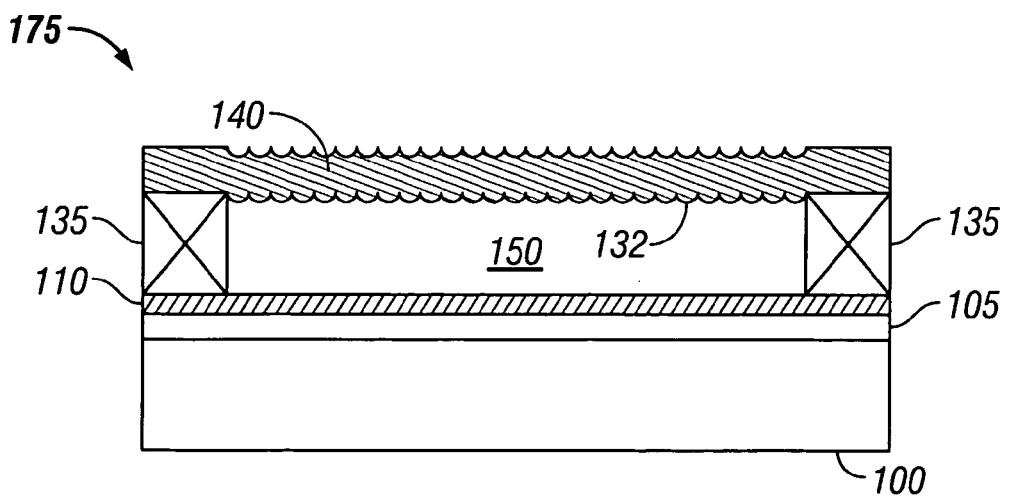

The process 200 continues at step 240 where the sacrificial layer 115 is removed (e.g., by etching) to form a cavity 150 as shown in FIG. 10G. Removal of the sacrificial layer 115 results in the electrically conductive layer 140 having a non-planar surface 132. The non-planarity of the surface 132 may be due to the optional presence of the remaining portion of the permeable layer 125 on the underside of the second electrically conductive layer 140 (not illustrated). The removal of the sacrificial layers can be accomplished, for example, by exposure to an etchant such as $XeF_2$ (as depicted in FIG. 10F), $F_2$ or HF alone or in combination. In a preferred embodiment, substantially all of the sacrificial layer 115 is removed in the etching process. In one embodiment, the cavity 150 is an interferometric cavity between an optical stack (comprising the electrically conductive layer 105 and the dielectric layer 110) and the conductive movable layer 140. After formation of the cavity 150, the resulting MEMS device, e.g., the interferometric modulator 175, is in a "released" state.

In some embodiments, the process 200 can use a first etchant to form one or more support structure apertures and a second etchant to flow through the permeable layer 125 to form the non-planar surface 130 on the sacrificial layer 115 as shown in FIG. 10E. The first etchant may be the same or different from the second etchant. The material of the permeable layer 125 may be etchable or non-etchable by the first etchant.

In an embodiment, the permeable layer 125 is formed prior to patterning the sacrificial layer 115 with the first etchant to form the one or more support structure apertures. The material of the permeable layer 125 may be etchable or non-etchable with the first etchant, preferably etchable to reduce potential formation of loose particles from the permeable layer 125 that may foul the lower layers. The second etchant may be used to form the non-planar surface 130 on the sacrificial layer 115. The permeable layer 125 may be removed (e.g., by etching) or allowed to remain after forming the non-planar surface 130.

In another embodiment, the sacrificial layer 115 is patterned with the first etchant to form the one or more support structure apertures. The permeable layer 125 is then formed, after which the non-planar surface 130 may be formed on the sacrificial layer 115 with the second etchant. The permeable layer 125 may then be removed or allowed to remain in this embodiment. The permeable layer 125 may be removed (e.g., by etching) in order to avoid leaving portions of the permeable layer on the regions of the sacrificial layer that were previously patterned.

In another embodiment, the permeable layer 125 is formed prior to patterning the sacrificial layer 115 with the first etchant. The second etchant may then be used to form the non-planar surface 130 on the sacrificial layer 115. The support structure apertures may be formed by etching the sacrificial layer 115 with the first etchant. The material of the permeable layer 125 may be etchable or non-etchable with the first etchant, preferably etchable as discussed above to reduce potential formation of loose particles from the permeable layer 125 that may foul the lower layers. The remaining permeable layer 125 may be removed (e.g., by etching) or allowed to remain.

In some embodiments, another layer, e.g., the dielectric layer 110, is considered to be a sacrificial layer. For example, the permeable layer 125 may be deposited on the dielectric layer 110. A portion of the dielectric layer may be removed by flowing an etchant through the pores or discontinuities in the permeable layer. A non-planar surface may be formed on the dielectric layer 110 using etchants selected to remove the materials that the dielectric layer comprises. The result will be a non-planar surface on the dielectric layer 110. Details of the dimensions and characteristics of the non-planar surface formed will be discussed below. In another embodiment non-planar surfaces may be formed on both the dielectric layer 110 (or the electrically conductive layer 105) and the second electrically conductive layer 140. In some embodiments, the process 200 may include additional steps and the steps may be rearranged from the illustrations of FIGS. 9 and 10.

In some embodiments, the dielectric layer 110 comprises sub-layers, e.g., an oxide of silicon may be an underlying layer and an oxide of aluminum may be an overlying layer. The oxide of aluminum may serve as an etch stop for performing the release etch in the fabrication of a MEMS device. In this embodiment, a permeable layer (which may also be an oxide of aluminum, e.g., anodized aluminum) may be formed over the underlying sub-layer comprising an oxide of silicon. A non-planar surface may be formed on the underlying layer by flowing an etchant through the permeable layer. Dry etching utilizing etchants such as $SF_6$, $CHF_3$ and/or $CF_4$ in combination with oxygen and/or helium may be used in these embodiments. The overlying etch stop sub-layer comprising may be deposited with or without removing the permeable layer, as generally described above.

In some embodiments, the electrically conductive layer 105 comprises metal sub-layers. In an interferometric modulator, a transparent ITO sub-layer may serve as an electrically conductive layer and a chromium sub-layer may serve as a partially reflective layer. In this embodiment, a permeable layer of chromium may be formed (e.g., by flash deposition using CVD, PVCVD or PVD) over the underlying sub-layer comprising ITO. A non-planar surface may be formed on the underlying layer by flowing an etchant through the permeable layer. Wet etching utilizing etchants such as HCl, $FeCl_3$ and/or $HNO_3$ may be used in these embodiments. The overlying electrically conductive sub-layer may be deposited with or without removing the permeable chromium layer.

In some embodiments, the substrate 100 may serve as the underlying layer. In the case of a glass substrate, a permeable layer comprising chromium and/or an oxide of aluminum may be formed over the substrate. A non-planar surface may be formed on the glass substrate by flowing an etchant through the permeable layer. Dry etching utilizing etchants such as $SF_6$, $CHF_3$ and/or $CF_4$ in combination with oxygen and or helium may be used in these embodiments. An overlying layer may be deposited with or without removing the permeable layer.

The non-planar surfaces formed on the second electrically conductive layer 140, the dielectric layer 110, the electrically conductive layer 105, and or the substrate 100 serve to reduce the area of contact between the second electrically conductive layer 140 and the dielectric layer 110 when the interferometric modulator 175 is in the actuated position, thereby reducing or preventing stiction as discussed above. Details of the preferred dimensions and characteristics exhibited by the non-planar surface 130 formed on the sacrificial layer 115 and the resulting non-planar surface 132 formed on the second electrically conductive layer 140 will now be discussed.

Adhesion forces may arise from several mechanisms such as capillary forces, van der Waals interactions, chemical bonds, and trapped charges. To reduce adhesion forces, chemical reactions, such as the short timed etching of sacrificial layer 115 through the permeable layer 125, may be used to increase the surface roughness of one or more of the contacting surfaces. Increasing the surface roughness reduces the contact area of the contacting surfaces, thereby reducing stiction. In some embodiments, a simple increase in surface roughness is undesirable. For example, in an interferometric modulator, an increase in surface roughness may detrimentally affect the optical qualities of the optical stack 16 and/or the movable reflective layer 14. However, it has been found that by proper deposition of the permeable layer and subsequent removal of the sacrificial layer, stiction may be reduced without detrimentally affecting surface roughness.

Figure 12A:
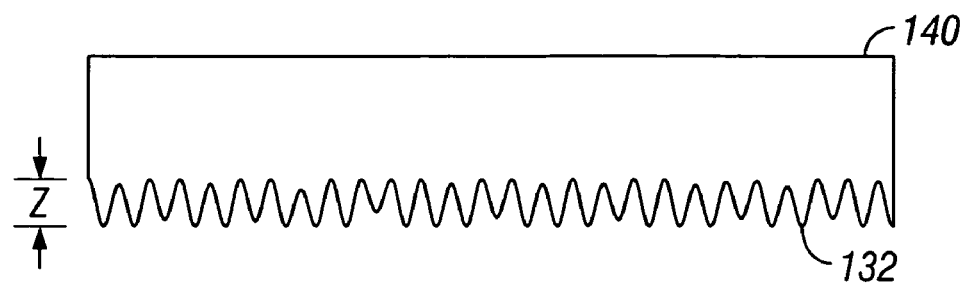
FIGS. 12A, 12B and 12C illustrate cross sectional views of alternative embodiments of surface asperities of non-planar surfaces that may be formed by the process of FIG. 9.
Figure 12B:
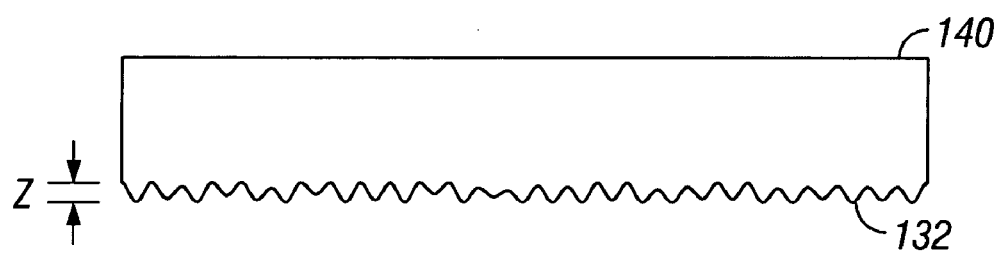
Figure 12C:
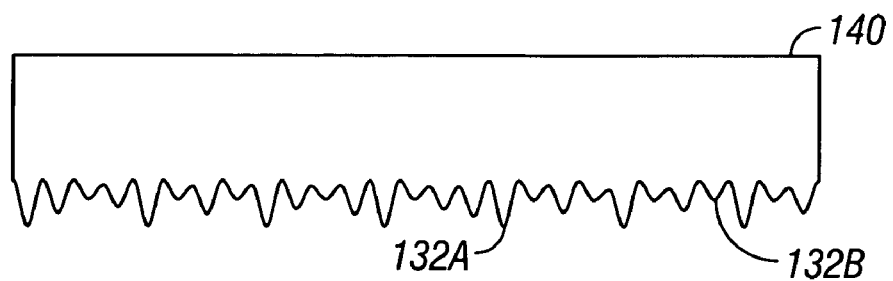

Surface roughness can be characterized by statistical distributions of the variation in heights of peaks (or surface asperities) where a probability density function models the frequency that surface asperities of differing heights occur. FIGS. 12A, 12B and 12C illustrate examples of surfaces with different statistical distributions of surface asperity heights.

FIGS. 12A and 12B display examples of non-planar surfaces, such as the non-planar surface 132 formed on the second electrically conductive layer 140 when deposited on the non-planar surface 130 of the sacrificial layer 115 as discussed above. The surface asperity heights "z" of the non-planar surface 132 in FIG. 12A are higher on average than the surface asperity heights "z" of the non-planar surface 132 in FIG. 12B. The higher surface asperities of FIG. 12A would be advantageous in reducing adhesion forces somewhat, but may increase surface roughness to such an extent that optical qualities are detrimentally affected. However, with similar real contact areas in FIGS. 12A and 12B, the adhesion forces may still be similar for surface asperity heights on the order of about 10 angstroms to about 50 angstroms. A more preferred distribution of surface asperity heights is shown in FIG. 12C. In FIG. 12C, the non-planar surface 132 is characterized by relatively infrequent high surface asperities 132A and relatively frequent low surface asperities 132B. This distribution of surface asperity heights increases the surface separation and reduces the real contact area. The surface profiles illustrated in FIGS. 12A, 12B and 12C are not drawn to scale and the height differences between the high surface asperities 132A and the low surface asperities 132B may be quite small. The height differences may be small enough that surface roughness is not detrimentally increased (e.g., increased so as to negatively affect optical qualities), but real contact area and stiction may still be desirably reduced.

In one embodiment, the RMS (root-mean-square) surface asperity heights are formed so as to be in a range from about 10 angstroms to about 100 angstroms, preferably in a range from about 20 angstroms to about 50 angstroms. It is important to note that FIGS. 12A, 12B and 12C show the peaks resulting from depositing the second electrically conductive layer 140 on the non-planar surface 130 formed on the sacrificial layer 115. This means that in order to obtain the widely spaced relatively high peaks as shown in FIG. 12C, the permeable layer should be formed such that when the non-planar surface 130 is formed, it has opposite contours, widely spaced relatively deep narrow valleys. The opposite is true when forming the non-planar surface on the dielectric layer 110. In this case, the permeable layer should be formed such that when the non-planar surface is formed on the dielectric layer, it has the contours shown in FIG. 12C, widely spaced relatively high narrow peaks.

Surface asperity heights of many surfaces follow a probability density function which is most commonly Gaussian in distribution. Surfaces having a Gaussian distribution of surface asperity heights exhibit a symmetric distribution of the surface asperity heights about some mean value (peak and valley heights are symmetrical) and typically exhibit a certain degree of stiction. Surfaces exhibiting surface asperities with a probability density function having an asymmetry relative to the mean, known as skewness, are desirable for stiction reduction. Likewise, surfaces exhibiting surface asperities with a probability density function having higher values of kurtosis are desirable for stiction reduction. For a discussion of skewness and kurtosis effects on surfaces see the publication by Tayebi et al., "Reducing the effects of adhesion and friction in microelectromechanical systems (MEMS) through surface roughening: comparison between theory and experiments," Journal of Applied Physics, 98, 073528 (2005).

The methods described herein for reducing stiction by forming a non-planar surface (e.g., the non-planar surface 132 formed as illustrated in FIG. 10) may have a positive effect on the statistical distribution of surface asperities (as shown by measures of kurtosis and skewness) and thus may provide reduced stiction without significantly affecting the roughness (nor the optical characteristics) of the surface. For example, Table 1 summarizes the results of a set of experiments in which a molybdenum sacrificial layer was modified to reduce surface stiction in accordance with an embodiment of the methods described herein. In the experiments, a 20 angstrom thick permeable layer of $Al_2O_3$ was deposited over a layer of molybdenum. A non-planar surface was then formed by flowing a sulfur hexafluoride etchant through the permeable layer to remove a portion of the surface of the molybdenum. Various surface characteristics were measured by performing atomic force microscopy measurements on the molybdenum layer before and after treatment as shown in Table 1.

TABLE 1

| Measurement | Before Treatment | After Treatment | % change |
| --- | --- | --- | --- |
| Skewness | −0.08 | 0.09 | >200% reversal |
| Kurtosis | 3.08 | 3.32 | +7.8% |
| Roughness (RMS) | 2.13 (nm) | 2.13 (nm) | No change |
| Roughness (avg.) | 1.70 (nm) | 1.68 (nm) | −1.2% |
| Max. Roughness | 18.73 (nm) | 20.39 (nm) | +8.9% |

As can be seen, treatment of the molybdenum surface reversed the sign of the skewness parameter, from a negative 0.08 to a positive 0.09. The reversal of skewness to a positive value indicates that the treatment produced more frequent low surface asperities and less frequent high aspertities in the treated molybdenum (Mo), which is desirable for reducing stiction. The results in Table 1 also show that kurtosis was increased by nearly 8 percent. An increased kurtosis indicates that the treatment produced a lower frequency of high surface asperities in the treated molybdenum, which is also a positive indication for possible stiction reduction. Table 1 also shows the results of several surface roughness measurements. Large changes in multiple surface roughness parameters indicate decreased optical quality. The roughness parameters shown in Table 1 include the RMS roughness, the average roughness, and the maximum roughness (the distance from the highest peak to the lowest valley). As can be seen, there was little or no change in the RMS and average roughness and a relatively small increase (8.9%) in the maximum roughness. Therefore, while the kurtosis and skewness measurements indicate likely stiction reduction, the roughness measurements show little evidence of changes significant enough to reduce optical quality. This is highly desirable for improving the performance of an interferometric modulator without detrimentally affecting the optical performance.

By varying the duration of the deposition and/or the amount of material deposited to form the permeable layer 125, as well as varying the duration of the timed etch for removing part of the sacrificial layer 115, various surface topographies will be formed. By measuring the surface asperity statistics, preferably using atomic force microscopy, the deposition and etching durations and/or amounts that result in preferred ranges of skewness and kurtosis may be obtained. In a preferred embodiment, the skewness is greater than about zero and the kurtosis is greater than about 3. It is important to note that these surface asperity characteristics of skewness and kurtosis apply to non-planar surfaces formed on a layer that remains after release of the MEMS device (e.g., not a sacrificial layer such as the sacrificial layer 115 above). For example, the dielectric layer 110 is such a layer. The preferred non-planar surface formed on the dielectric layer 110 (or the electrically conductive layer 105) would have many wide valleys and relatively few narrow peaks. This may be achieved by, e.g., forming a permeable layer comprised of many small islands spaced relatively far apart from each other. A non-planar surface formed on the sacrificial layer 115 would preferably have surface asperity heights exhibiting a kurtosis greater than about 3 and a skewness less than about zero. This will result in the second electrically conductive layer 140, that is deposited over the non-planar sacrificial layer 115, having preferred surface asperity height characteristics of skewness greater than about zero and kurtosis greater than about 3. The preferred non-planar surface 130 formed on the sacrificial layer 115 would have many wide hills (that become wide valleys on the second electrically conductive layer 140) and relatively few narrow valleys (that become narrow peaks on the second electrically conductive layer 140). This may be achieved by, e.g., forming a permeable layer comprised of many big islands with small pin-holes between the islands.

It is known that reducing stiction in MEMS devices, e.g. by using embodiments as described above, extends the lifetime of the MEMS devices. In the case of interferometric modulators, the increase in lifetime may be increased by a factor of 2-3 or more. With proper surface asperity height characteristics, as discussed above, this increase in lifetime may be obtained without adversely affecting the optical or electromechanical behavior.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of making a microelectromechanical system (MEMS) device, comprising:
    forming a permeable layer over an underlying layer material using a non-lithographic method, wherein the permeable layer comprises a masking material more resistant to removal by an etchant than the underlying layer material;
    removing a portion of the underlying layer material by flowing the etchant through the permeable layer, thereby forming a non-planar surface on the remaining underlying layer material; and
    depositing an overlying layer over the non-planer surface formed on the underlying layer to form a non-planar interface between the underlying layer and the overlying layer.

2. The method of claim 1, wherein the underlying layer material comprises at least one of glass and plastic.

3. The method of claim 1, further comprising removing substantially all of the permeable layer after removing the portion of the underlying layer.

4. The method of claim 1, wherein the underlying layer material comprises a metal.

5. The method of claim 1, wherein the underlying layer comprises a dielectric material.

6. The method of claim 1, wherein the permeable layer comprises aluminum.

7. A method of making a microelectromechanical system (MEMS) device, comprising:
    providing a substrate;
    depositing a sacrificial material over at least a portion of the substrate, the sacrificial material being removable by a first etchant;
    forming a permeable layer over the sacrificial material using a non-lithographic method, wherein the permeable layer comprises a masking material more resistant to removal by the first etchant than the sacrificial material;
    removing a portion of the sacrificial material by flowing the first etchant through the permeable layer, thereby forming a non-planar surface on the remaining sacrificial material; and
    forming an electrically conductive layer over at least a portion of the non-planar surface.

8. The method of claim 7, wherein forming the permeable layer comprises flash depositing the masking material.

9. The method of claim 8, wherein the masking material comprises at least one of aluminum and aluminum oxide.

10. The method of claim 7, wherein forming the permeable layer comprises:
    depositing a layer of aluminum over the sacrificial material; and
    anodizing the layer of aluminum.

11. The method of claim 7, further comprising removing substantially all of the permeable layer after removing the portion of the sacrificial material.

12. The method of claim 11, wherein removing the permeable layer comprises:
    selectively etching the permeable layer with a second etchant, the second etchant being more effective at removing the masking material than removing the sacrificial material.

13. The method of claim 7, further comprising forming a dielectric layer over the substrate, wherein the sacrificial material comprises a dielectric material of the dielectric layer.

14. The method of claim 7, further comprising removing substantially all of the remaining sacrificial material, thereby forming a cavity between the substrate and the electrically conductive layer.

15. The method of claim 7, wherein the substrate comprises a second electrically conductive layer.

16. The method of claim 15, wherein the second electrically conductive layer comprises indium tin oxide.

17. The method of claim 7, wherein forming the permeable layer comprises:
    forming a continuous mask layer over the sacrificial material, the continuous mask layer comprising a plurality of regions configured to be removable at different relative rates; and
    removing a portion of the continuous mask layer.

18. The method of claim 17, wherein removing the portion of the continuous mask layer comprises exposing the continuous mask layer to the first etchant.

19. The method of claim 17, wherein removing the portion of the continuous mask layer comprises exposing the continuous mask layer to a second etchant.

20. The method of claim 7, wherein the electrically conductive layer comprises a movable layer.

21. The method of claim 7, wherein the substrate comprises a partially reflective layer.

22. A method of making an interferometric modulator, comprising:
    providing a substrate;
    depositing a first electrically conductive layer over at least a portion of the substrate;

depositing a sacrificial material over at least a portion of the first electrically conductive layer, the sacrificial material being removable by an etchant;

forming a permeable layer over the sacrificial material using a non-lithographic method, wherein the permeable layer comprises a masking material;

removing a portion of the sacrificial material by flowing the etchant through the permeable layer, thereby forming a non-planar surface on the sacrificial material; and forming a second electrically conductive layer over at least a portion of the non-planar surface.

23. The method of claim 22, wherein forming the permeable layer comprises flash depositing the masking material.

24. The method of claim 23, wherein the masking material comprises at least one of aluminum and aluminum oxide.

25. The method of claim 22, wherein forming the permeable layer comprises:

depositing a layer of aluminum over the sacrificial material; and anodizing the layer of aluminum.

26. The method of claim 22, further comprising removing substantially all of the permeable layer after removing the portion of the sacrificial material.

27. The method of claim 22, further comprising forming a dielectric layer over the first electrically conductive layer.

28. The method of claim 27, wherein the sacrificial material comprises a dielectric material of the dielectric layer.

29. The method of claim 27, further comprising depositing the sacrificial material over the dielectric layer.

30. The method of claim 22, wherein the first electrically conductive layer comprises indium tin oxide.

31. The method of claim 22, wherein the second electrically conductive layer comprises a movable layer.

32. The method of claim 22, wherein forming the permeable layer comprises:

forming a continuous mask layer over the sacrificial material, the continuous mask layer comprising a plurality of regions configured to be removable at different relative rates; and removing a portion of the continuous mask layer.

33. The method of claim 32, wherein removing the portion of the continuous mask layer comprises exposing the continuous mask layer to the etchant.

34. The method of claim 32, wherein removing the portion of the continuous mask layer comprises exposing the continuous mask layer to a second etchant.

35. The method of claim 22, further comprising removing a substantial portion of the permeable layer while removing the portion of the sacrificial material.

36. The method of claim 22, further comprising:

forming a support structure aperture in a portion of the deposited sacrificial material; and depositing an insulator into the support structure aperture.

37. An unreleased interferometric modulator made by the method of claim 22.

38. The method of claim 22, further comprising removing substantially all of the remaining sacrificial material, thereby forming a cavity between the substrate and the electrically conductive layer.

39. A released interferometric modulator made by the method of claim 38.

* * * * *

UNITED STATES PATENT AND TRADEMARK OFFICE
CERTIFICATE OF CORRECTION

| | |
|---|---|
| PATENT NO. | : 7,623,287 B2 |
| APPLICATION NO. | : 11/406866 |
| DATED | : November 24, 2009 |
| INVENTOR(S) | : Teruo Sasagawa, Lior Kogut and Ming-Hau Tung |

It is certified that error appears in the above-identified patent and that said Letters Patent is hereby corrected as shown below:

On the Title Page
Item 56 Page 2, line 4, under U.S. Patent Documents, please delete "te Velde" and insert therefore, --Te Velde--, Item 56 Page 2, line 7, under U.S. Patent Documents, please delete "te Velde" and insert therefore, --Te Velde--, Item 56 Page 2, line 10, under U.S. Patent Documents, please delete "te Velde" and insert therefore, --Te Velde--, Item 56 Page 3, line 57, below "5,967,163 A 10/199 Pan et al." please insert therefore, --5,968,796 A 11/1999 Miles--, Item 56 Page 3, line 70, after "Jr.", please insert therefore, --deceased--, Item 56 Page 6, line 7, under Other Publications, please delete "technoIogy" and insert therefore, --technology--, Item 56 Page 6, line 12, under Other Publications, please delete "Quanum" and insert therefore, --Quantum--, Item 56 Page 6, line 65, under Other Publications, please delete "8-8186-8900" and insert therefore, --0-8186-8900,--, Item 56 Page 7, line 4, under Other Publications, please delete "Aluminoa" and insert therefore, --Alumina--, Item 56 Page 7, line 10, under Other Publications, please delete "compatable" and insert therefore, --compatible--, Item 56 Page 7, line 14, under Other Publications, please delete "vo 337" and insert therefore, --vol. 337--, Signed and Sealed this Fifteenth Day of June, 2010

David J. Kappos
*Director of the United States Patent and Trademark Office*

CERTIFICATE OF CORRECTION (continued)
U.S. Pat. No. 7,623,287 B2

Item 56 Page 7, line 16, under Other Publications, please delete ""Maniature" and insert therefore, --"Miniature--, Item 56 Page 7, line 19, under Other Publications, please delete "Internatioal" and insert therefore, --International--, Item 56 Page 7, line 19, under Other Publications, please delete "Andactuators," and insert therefore, --And actuators,--, Item 56 Page 7, line 19-20, under Other Publications, please delete "New Youk" and insert therefore, --New York--, Item 56 Page 7, line 44, under Other Publications, please delete "microelectomechanical systesm" and insert therefore, --microelectromechanical system--, Item 56 Page 7, line 45, under Other Publications, please delete "Comparisoion" and insert therefore, --Comparison--, Sheet 9 of 13, Reference Numeral 243, Fig. 9C, line 2, please delete "CONTINOUS" and insert therefore, --CONTINUOUS--, At column 14, line 41, please delete "anoidized" and insert therefore, --anodized--, At column 20, line 29, please delete "aspertities" and insert therefore, --asperities--, At column 21, line 49 in Claim 1, please delete "non-planer" and insert therefore, --non-planar--.

UNITED STATES PATENT AND TRADEMARK OFFICE
CERTIFICATE OF CORRECTION

PATENT NO. : 7,623,287 B2
APPLICATION NO. : 11/406866
DATED : November 24, 2009
INVENTOR(S) : Sasagawa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 509 days.

Signed and Sealed this

Twenty-sixth Day of October, 2010

David J. Kappos
*Director of the United States Patent and Trademark Office*